United States Patent
Shahparnia et al.

(10) Patent No.: US 11,700,441 B1
(45) Date of Patent: Jul. 11, 2023

(54) POSITION SENSOR ARCHITECTURE FOR CAMERAS

(71) Applicant: Apple Inc., Cupertino, CA (US)

(72) Inventors: Shahrooz Shahparnia, Monte Sereno, CA (US); Anish Bhide, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 121 days.

(21) Appl. No.: 17/237,896

(22) Filed: Apr. 22, 2021

Related U.S. Application Data

(60) Provisional application No. 63/014,644, filed on Apr. 23, 2020.

(51) Int. Cl.
| | | |
|---|---|---|
| H04N 5/232 | (2006.01) | |
| G03B 5/00 | (2021.01) | |
| G01R 33/07 | (2006.01) | |
| H04N 23/55 | (2023.01) | |
| G01R 33/09 | (2006.01) | |
| H04N 23/68 | (2023.01) | |

(52) U.S. Cl.
CPC ............ H04N 23/55 (2023.01); G01R 33/07 (2013.01); G01R 33/072 (2013.01); G01R 33/098 (2013.01); H04N 23/685 (2023.01)

(58) Field of Classification Search
CPC ...... H04N 23/68; G03B 5/00; G03B 2205/00; G01R 33/07
USPC .................................................. 348/208.99
See application file for complete search history.

(56) References Cited

U.S. PATENT DOCUMENTS

| | | | |
|---|---|---|---|
| 7,620,305 B2 | 11/2009 | Noji | |
| 9,407,799 B2 | 8/2016 | Kasamatsu | |
| 2005/0265704 A1* | 12/2005 | Uenaka | H04N 5/23287 348/E5.046 |
| 2006/0256209 A1 | 11/2006 | Yoshida et al. | |
| 2010/0239237 A1* | 9/2010 | Lee | G03B 17/00 396/55 |

FOREIGN PATENT DOCUMENTS

KR 10-2011-0007840 A * 1/2011 ......... H04N 5/23287

* cited by examiner

*Primary Examiner* — Anthony J Daniels
(74) *Attorney, Agent, or Firm* — Robert C. Kowert; Kowert, Hood, Munyon, Rankin & Goetzel, P.C.

(57) ABSTRACT

A camera system may include circuitry for measuring the positions of an optics assembly (e.g., one or more lenses) and/or an image sensor of the camera system. The circuitry may include analog circuits comprising a first and a second position sensors to produce a first and a second sensor signals based on a first magnetic field and a second magnetic field respectively. The magnetic fields may have the same or different polarities detectable by the position sensors. The position sensors may be coupled in parallel in the same or reverse directions to produce a combined sensor output. The circuitry may determine position information for the optics assembly and/or the image sensor based on the combined sensor output. The camera system may use the position information as a feedback signal to control the position of the optics assembly (e.g., for autofocus) and/or the position of the image sensor (e.g., for optical image stabilization (OIS)).

20 Claims, 12 Drawing Sheets

… …

POSITION SENSOR ARCHITECTURE FOR CAMERAS

This application claims benefit of priority to U.S. Provisional Application Ser. No. 63/014,644, entitled "Position Sensor Architecture for Cameras," filed Apr. 23, 2020, and which is incorporated herein by reference in its entirety.

BACKGROUND

Technical Field

This disclosure relates generally to a camera and more specifically to measurement of the position information of an optics assembly (e.g., one or more lenses) and/or an image sensor of the camera in mobile devices.

Description of the Related Art

The advent of mobile multipurpose devices such as smartphones, tablet or pad devices has resulted in a need for bigger lenses such as ultra- or super-wide lenses for integration in cameras of the devices. Some cameras may incorporate optical image stabilization (OIS) mechanisms that may sense and react to external excitation/disturbance by adjusting location of the optical lens on the X and/or Y axis in an attempt to compensate for unwanted motion of the lens. Furthermore, some cameras may incorporate an autofocus (AF) mechanism whereby the object focal distance can be adjusted to focus an object plane in front of the camera at an image plane to be captured by the image sensor. In some such AF mechanisms, the optical lens is moved as a single rigid body along the optical axis of the camera to refocus the camera.

In addition, high image quality is easier to achieve in small form factor cameras if lens motion along the optical axis is accompanied by minimal parasitic motion in the other degrees of freedom, for example on the X and Y axes orthogonal to the optical (Z) axis of the camera. Thus, some small form factor cameras that include autofocus mechanisms may also incorporate optical image stabilization (OIS) mechanisms that may sense and react to external excitation/disturbance by adjusting location of the optical lens and/or the image sensor on the X and/or Y axis in an attempt to compensate for unwanted motion of the lens. In such systems, knowledge of the position of the lens and/or the image sensor is useful.

Figure 1A:
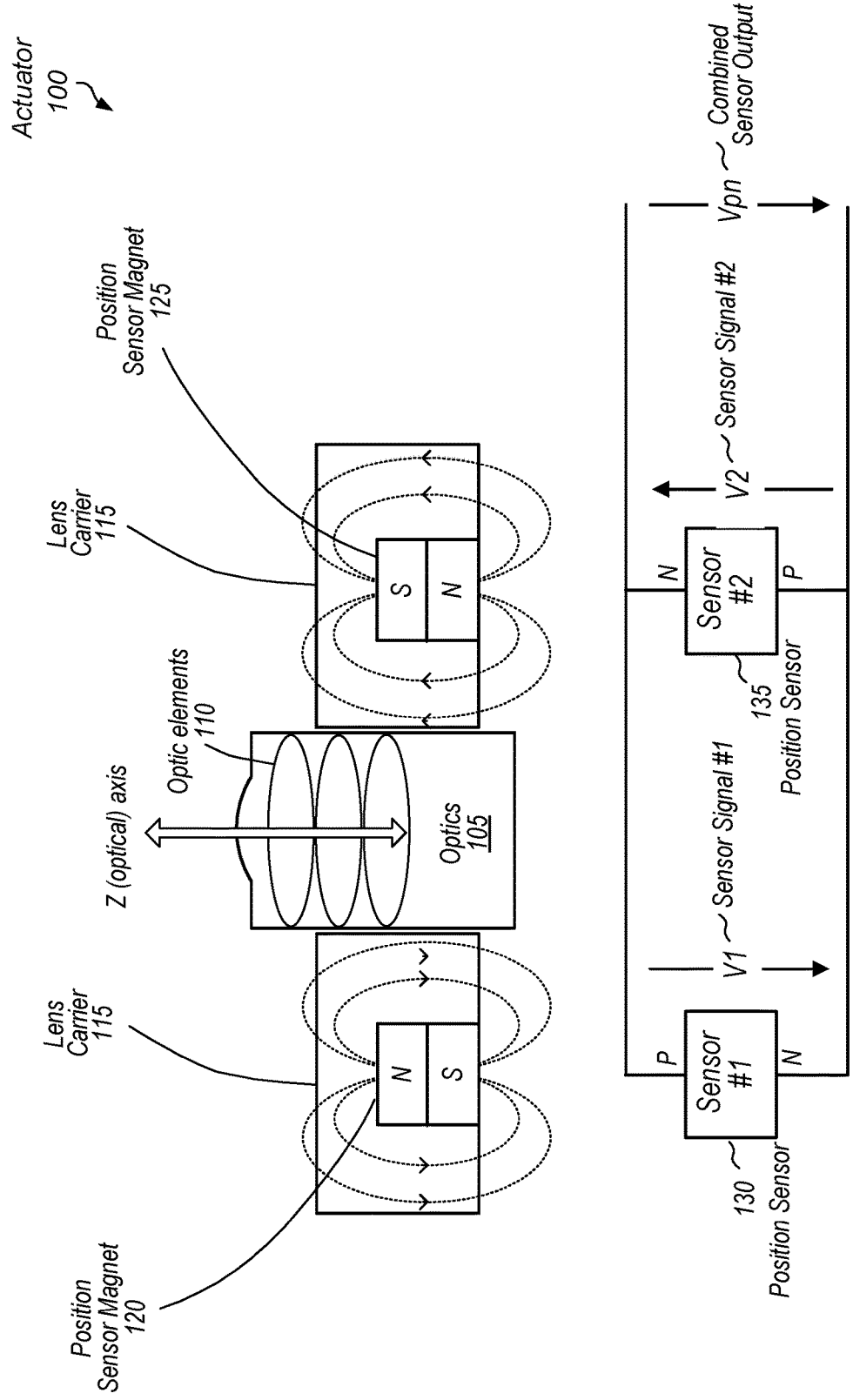
FIG. 1A depicts a schematic diagram illustrating example measurement of autofocus position and/or image sensor position of a camera system, according to some embodiments.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

"Comprising." This term is open-ended. As used in the appended claims, this term does not foreclose additional structure or steps. Consider a claim that recites: "An apparatus comprising one or more processor units . . . ." Such a claim does not foreclose the apparatus from including additional components (e.g., a network interface unit, graphics circuitry, etc.).

"Configured To." Various units, circuits, or other components may be described or claimed as "configured to" perform a task or tasks. In such contexts, "configured to" is used to connote structure by indicating that the units/circuits/components include structure (e.g., circuitry) that performs those task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. § 112, sixth paragraph, for that unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue. "Configure to" may also include adapting a manufacturing process (e.g., a semiconductor fabrication facility) to fabricate devices (e.g., integrated circuits) that are adapted to implement or perform one or more tasks.

"First," "Second," etc. As used herein, these terms are used as labels for nouns that they precede, and do not imply any type of ordering (e.g., spatial, temporal, logical, etc.). For example, a buffer circuit may be described herein as performing write operations for "first" and "second" values.

The terms "first" and "second" do not necessarily imply that the first value must be written before the second value.

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B.

DETAILED DESCRIPTION

Various embodiments described herein relate to measurement of the positions of an optics assembly (e.g., one or more lenses) and/or an image sensor of a camera system of a mobile device. In some embodiments, the position measurement may be implemented based on measurement circuitry including a plurality of position sensors. The position sensors may be configured to measure the positions of the optics assembly and/or the image sensor based on measuring one or more magnetic fields produced by respective magnets. For instance, the sensor signal, e.g., an output voltage, of a position sensor may vary with the strength of the magnetic field detectable by the position sensor. The magnetic field may be produced with a position sensor (or position probe) magnet. For a given position sensor magnet, the strength of the magnetic field changes with the relative distance and/or angle between the position sensor magnet and the position sensor. Thus, the position of the position sensor magnet may be determined based on the value of the sensor signal from the position sensor. For instance, the camera system may include a position sensor magnet affixed to and thus moveable with the optics assembly (or the image sensor), whilst the position sensor may be attached to a stationary platform. Thus, as the optics assembly (or the image sensor) moves relative to the stationary platform, e.g., in an autofocus movement (or optical image stabilization (OIS) movement), the position of the position sensor magnet and the optics assembly (or the image sensor) may be measured with the position sensor.

In some embodiments, the measurement circuitry may comprise a plurality of position sensors including a first and second position sensors configured to produce a first sensor signal and a second sensor signal based on a first magnetic field and a second magnetic field (produced respectively by a first and second position sensor magnets) respectively. In some embodiments, the first and second magnetic fields may have the same or different polarities detectable by the first and second position sensors. In some embodiments, the first and second position sensors may be coupled (directly or indirectly) in parallel in the same or reverse directions to produce a combined sensor output. In some embodiments, the measurement circuitry may comprise a signal processing circuit to determine the position information, e.g., the position, distance, and/or angle, of the optics assembly and/or the image sensor of the camera system based on the combined sensor output. In some embodiments, the position information, e.g., the position, distance, and/or angle, may be determined relative to the corresponding position sensors.

In some embodiments, the first and second position sensor magnets are configured to be moveable with the optics assembly and/or the image sensor. As described above, the position sensor magnets may be affixed to the optics assembly and/or the image sensor and thus become moveable with respect to stationary position sensors. In some embodiments, the first and second position sensors may be configured to be moveable whilst the position sensor magnets may be affixed to a stationary platform. For instance, the position sensors may be attached to moveable part(s) of the camera system, e.g., the optics assembly and/or the image sensor.

In some embodiments, the position sensor magnets may be positioned at the same side of the optics assembly and/or the image sensor. In some embodiments, they may be placed at different locations, e.g., at diagnostically opposite positions around the camera system. In some embodiments, the position sensor(s) may include one or more of a Hall sensor, a tunneling magnetoresistance (TMR) sensor, a giant magnetoresistance (GMR) sensor, an anisotropic magnetoresistance (AMR) sensor, and so on.

In some embodiments, the camera system may include an actuator, e.g., a voice coil motor (VCM) actuator, to move the optics assembly and/or the image sensor based on the position measurement of the measurement circuitry. For instance, the actuator may take the position measurement of the optics assembly as a feedback signal and control the position of the optics assembly relative to the image sensor in an autofocus movement. Moreover, the actuator may move the image sensor relative to the optics assembly in an OIS movement based on the position measurement of the image sensor. In some embodiments, the camera system may use dedicated position sensor magnets, separate from other magnets, for measuring the position of the optics assembly and/or the image sensor. In some embodiments, the camera system may use the autofocus and/or OIS control magnets as the position sensor magnets to measure the position of the optics assembly and/or the image sensor, without separate/dedicated autofocus and/or OIS position sensor magnets.

FIGS. 1-4 illustrate embodiments of an example actuator assembly in which embodiments of position measurements as described herein may be applied. As one of skill in the art will readily ascertain in light of having read the included disclosure, a wide variety of configurations of position sensors and position sensor magnets fulfill differing design goals in different embodiments without departing from the scope and intent of the present disclosure. As one of skill in the art will readily ascertain in light of having read the included disclosure, a wide variety of configurations of actuator fulfill differing design goals in different embodiments without departing from the scope and intent of the present disclosure. For example, while the embodiments shown herein reflect voice coil motor actuators, one of skill in the art will readily understand that different actuators, including no-magnetic motorized actuators such as rotary motors or piezo-electric actuators, can be used with embodiments without departing from the scope and intent of the present disclosure.

FIG. 1A is a schematic diagram illustrating example measurement of autofocus position and/or image sensor position of a camera system, according to some embodiments. In this example shown in FIG. 1A, a camera system may include actuator 100 having optics 105 that may comprise one or more optical elements 110 and one or more image sensors (not shown). In some embodiments, the one or more optical elements 100 may include one or more flat or curved optic lenses. The optics assembly 105 may be mounted to a lens carrier 105. In some embodiments, the actuator 100 may include one or more coils and position control magnets that may interact with each other electro-magnetically to produce motive forces (e.g., Lorentz forces) moving the lens carrier (and thus the optics assembly 105) relative to the image sensor. For instance, the one or more actuators may move the optics assembly 105 close or further from the image sensor along the Z (optical) axis to implement autofocus. In some embodiments, the one or more actuator may also move the image sensor relative to the optics assembly 105. For instance, the one or more actuators may move the image sensor relative to the optics assembly 105 on a XY plane along X-Y axis that are orthogonal to the Z (optical) axis to implement the optical image stabilization (OIS).

In some embodiments, the camera system may include multiple position sensor magnets (or probe magnets) and associated position sensors to measure the position of the optics assembly 105 (hereinafter named "autofocus position") and/or the position of the image sensor. The camera system may further take the position measurement as a feedback signal to control the movement of the optics assembly 105 and/or the image sensor in autofocus and OIS. In this example shown in FIG. 1A, the actuator 100 of the camera system may include a first position sensor magnet 120 and a second position sensor magnet 125. The position sensor magnets 120 and 125 may be mounted upon the lens carrier 115 and thus become moveable with the optics assembly 105 relative to the image sensor, according to some embodiments. The actuator 100 may further include a first position sensor 130 and a second position sensor 135, both of which are positioned proximate the position sensor magnets 120 and 125 respectively. Thus, the position sensor 130 may detect predominantly the magnetic field produced by the position sensor magnet 120, whilst the position sensor 135 may interact predominantly with the magnetic field from the position sensor magnet 125. In some embodiments, the first and second position sensors 130 and 135 may include one or more of a Hall sensor, a tunneling magnetoresistance (TMR) sensor, a giant magnetoresistance (GMR) sensor, and/or an anisotropic magnetoresistance (AMR) sensor. In some embodiments, the position sensor magnets 120 and 125 may be arranged such that they create magnetic fields of different polarities detectable by the position sensors 130 and 135. For instance, as shown in FIG. 1A, the position sensor magnet 120 may be arranged to have its south pole towards the position sensor 130, and the position sensor magnet 125 may be placed to expose its north pole close to the position sensor 135. Thus, the position sensor 130 may detect predominantly the magnetic field from the south pole of the position sensor magnet 120, whilst the position sensor 135 may detect predominantly the magnetic field from the north pole of the position sensor magnet 125. The above arrangement may deduce sensor signals v1 and v2, e.g., output voltages, from respective P-N terminals of the position sensors 130 and 135 in opposite directions. For instance, the sensor signal v1 from the position sensor 130 may be a positive voltage whilst the sensor signal v2 from the position sensor 135 may be a negative voltage. As the optics assembly 105 (and/or position sensor magnets 120 and 125) move along the Z (optical) axis (and/or X-Y axes orthogonal to the Z axis), the magnetic fields detected by the position sensors 130 and 135 may vary and thus the sensor signals from the position sensors 130 and 135 may change according to the autofocus position of the optics assembly 105 relative to the image sensor. For instance, when the optics assembly 105 moves further away from the image sensor, the magnetic fields detected by the positions sensors 130 and 135 may become weaker, and the sensor signals from the position sensors 130 and 135 may reduce (e.g., the absolute values or amplitudes of v1 and v2 become smaller). Alternatively, when the optics assembly 105 moves closer relative to the image sensor, the magnetic fields detected by the position sensors 130 and 135 may become stronger, and the sensor signals from the position sensors 130 and 135 may increase (e.g., the absolute values or amplitudes of v1 and v2 become larger). In some embodiments, the position sensors 130 and 135 may be coupled in parallel in reverse directions, as shown in FIGS. 1A (and 2A), to produce a combined sensor output vpn. For instance, given the example in FIG. 1A, the sensor signal v1 may be a positive voltage across the P-N terminals of the position sensor 130, whilst the sensor signal v2 may be a negative voltage across the P-N terminals of the position sensor 135. In this example, the positions sensors 130 and 135 may be coupled in parallel in reverse directions with the P-terminal of the position sensor 130 electrically connected to the N-terminal of the position sensor 135, the N-terminal of the position sensor 130 electrically connected to the P-terminal of the position sensor 135, and the combined sensor output vpn created across the P-N terminals of the position sensor 130. In some embodiments, the position sensors 130 and 135 may be positioned spatially in substantially the same direction, such that the parallel coupling of the position sensors 130-135 in reverse directions may cancel the effect of an external magnetic field on the combined sensor output. Note that when the arrangement of the position sensor magnets 120 and 125 (e.g., the polarities of their respective magnetic fields) with respect to the position sensors 130 and 135 changes, the connection between the position sensors 130 and 135 may be adjusted accordingly. In some embodiments, the position information, e.g., the autofocus position, may be determined based on the combined sensor output vpn, which may be further used as a feedback signal to control the position of the optics assembly 105 in autofocus movements.

Figure 1B:
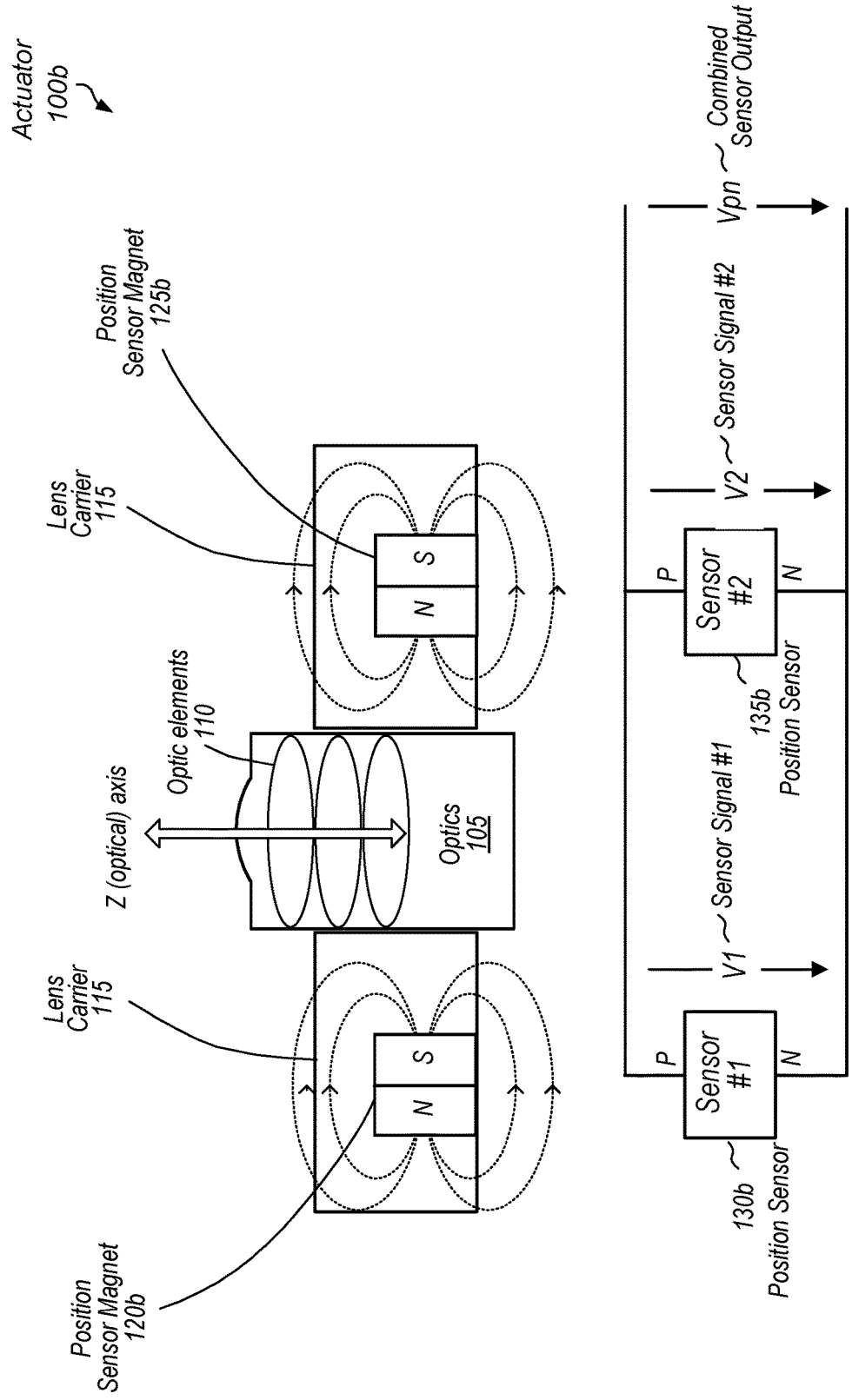
FIG. 1B depicts a schematic diagram illustrating another example measurement of autofocus position and/or image sensor position of a camera system, according to some embodiments

FIG. 1B is a schematic diagram illustrating another example measurement of autofocus position and/or image sensor position of a camera system, according to some embodiments. In this example, the actuator 100b of the camera may include a first and a second position sensor magnets 120b and 125b. In some embodiments, the position sensor magnets 120b and 125b may be mounted on the lens carrier 115. The actuator 100b may include a first and a second position sensors 130b and 135b, positioned proximate the position sensor magnets 120b and 125b, respectively. The position sensor magnets 120b-125b and position sensor 130b-135b may be configured such that the respective magnetic fields of the position sensor magnets 120b-125b detectable substantially by the position sensors 130b-135b may have the same polarity. For instance, as shown in FIG. 1B, both the position sensor 130b and 135b may primarily expose to the magnetic fluxes from north to south poles of the position sensor magnets 120b and 125b, respectively. As the position sensors 130b-135b may see the magnetic fields of the same magnetic polarity, the position sensors 130b-135b may produce sensor signals, e.g., v1 and v2 across respective P-N terminals, with the same electrical polarity. In some embodiments, the position sensors 130b and 135b may be coupled, directly or indirectly through electrical connections, in parallel (in the same direction) to produce a combined sensor output. For instance, as shown in FIG. 1B, the P terminal of the position sensor 130b may be coupled to the P terminal of the position sensor 135b, and the N terminal of the position sensor 130b may be coupled to the N terminal of the position sensor 135b, to produce the combined sensor output vpn. In some embodiments, the position sensors 130 and 135 may be positioned spatially in substantially opposite directions, such that the parallel coupling of the position sensors 130-135 in the same direction may cancel the effect of an external magnetic field on the combined sensor output.

As described above, the positions information, e.g., the position, distance, and/or angle, of autofocus optics assembly and/or image sensor of a camera may be measured by positions sensors working together with position sensor magnets. In some embodiments, the position sensor may measure the magnetic field of the position sensor magnetics and produce an analog position measurement signals, such as an output voltage. Generally, the raw output signal from a position sensor is a small value. Thus, the analog measurement signal may be amplified by an amplifier circuit, converted to digital signals by an A/D converter, and processed by a processor to calculate the position in the digital domain. As described above, the camera may use multiple position sensors to determine a position in order to eliminate common mode noises caused by an external magnetic field and improve measurement accuracy. In such configurations, the analog signals from the multiple sensors may be processed (e.g., by amplifier and A/D converter) individually in separate analog channels before they may be analyzed by the processor in combination to calculate the position. Each of the individual analog channels may be vulnerable to noises. Further, such configurations may require a large number of analog devices (e.g., amplifiers and A/D converters) and device I/O capacities. Issues like this may be addressed by combining the analog measurement signals first and then sending the combined analog signal to the digital domain for processing.

Figure 2A:
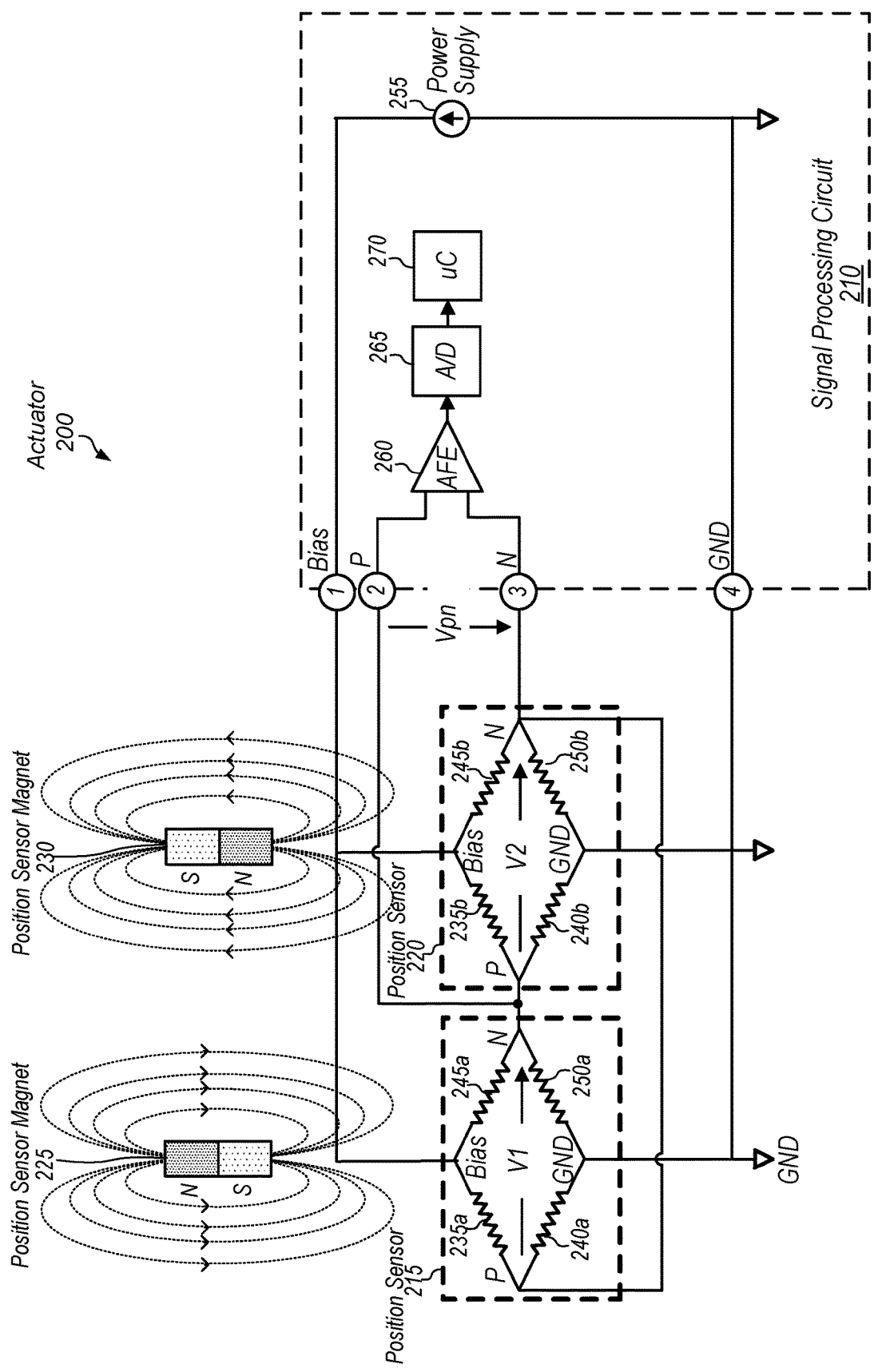
FIG. 2A depicts a schematic diagram of example measurement circuitry for measuring the autofocus position and/or image sensor position of a camera system, according to some embodiments.

FIG. 2A is a simplified schematic diagram showing example measurement circuitry for measuring the autofocus position and/or image sensor positions of a camera system, according to at least some embodiments. In the example shown in FIG. 2A, measurement circuitry 200 may comprise a plurality of position sensors including a first position sensor 215 and a second position sensor 220, as shown in FIG. 2A. In some embodiments, the position sensors 215-220 may include one or more of magnetic sensing elements, such as Hall sensors, tunneling magnetoresistance (TMR) sensors, giant magnetoresistance (GMR) sensors, anisotropic magnetoresistance (AMR), etc. Position sensors 215 and 220 may each be represented by an equivalent circuit including resistance 235a-250a and 235b-250b, respectively. In some embodiments, the measurement circuitry 200 may include a plurality of position sensor magnets including a first position sensor magnet 225 and a second position sensor magnet 230. The first and second position sensors 215-220 may be positioned proximate the first and second position sensor magnets 225-230, respectively, such that the first position sensor 215 may measure predominantly the magnetic field produced by the first position sensor magnet 225 whilst the second position sensor 220 may measure predominantly the magnetic field produced by the first position sensor magnet 230. The position sensors 215 and 220 may have terminals "Bias" and "GND" to receive the bias current from power supply 255. With the exposure to the magnetic fields provided respectively by the position sensor magnets 225-230, the position sensors 215-220 may produce respective measurement signals, such as output voltages v1 and v2, across terminals "P" and "N". Because the position sensors 215-220 measure the magnetic fields of different polarities, the voltages v1 and v2 may have opposite polarities, as described above in FIG. 1A. In some embodiments, the position sensor magnets 225-230 may be arranged to provide the magnetic fields of different polarities detectable by the position sensors 215-220. For instance, as shown in FIG. 2A, the first position sensor 215 may detect predominantly the magnetic field from the south pole of the first position sensor magnet 225, whilst the second position sensor 220 may detect predominantly the magnetic field from the north pole of the second position sensor magnet 230. This way, the measurement signals v1 and v2 of the position sensors 215 and 220 may have opposite polarities. As shown in FIG. 2A, in some embodiments, the position sensors 215 and 220 may be coupled in parallel in reverse directions to produce a combined sensor output vpn that may include an average of the respective sensor signals v1 and v2. As shown in FIG. 2A, the P terminal of the first position sensor 215 may be coupled to the N terminal of the second position sensor 220, the N terminal of the first position sensor 215 may be coupled to the P terminal of the second position sensor 220, and then the combined sensor output vpn may be provided from the respective coupled terminals. Combining the measurement signals v1 and v2 into one combined sensor output may result in a less number of analog signals, e.g., one analog signal vpn rather than two analog signals v1 and v2, thus reducing exposure to signal processing noises as well as requirements on analog devices. As shown in FIG. 2A, the combined sensor output vpn may be provided to signal processing circuit 210. The signal processing circuit 210 may include an active front end (AFE) 260 to condition and amplify vpn, an A/D converter 265 to convert the analog signal vpn into a digital signal, and a processor 270 to determine the position for the optics assembly and/or image sensor of the camera based on the combined sensor output. As described above, once the measurement of the autofocus position and/or the image sensor position measurement become available, the camera system may use the position measurement as a feedback signal to control the movement of the optics assembly (e.g., in autofocus) and/or the image sensor (e.g., in OIS). For purposes of illustration, power supply 255 is shown to be part of the signal processing circuit 210. In some embodiments, the power supply 255 may not have to be within the signal processing circuit 210 but instead be implemented by separate circuit(s) or device(s). The same may apply to other components shown in FIG. 2A, such as the AFE 260 and/or A/D converter 265.

Figure 2B:
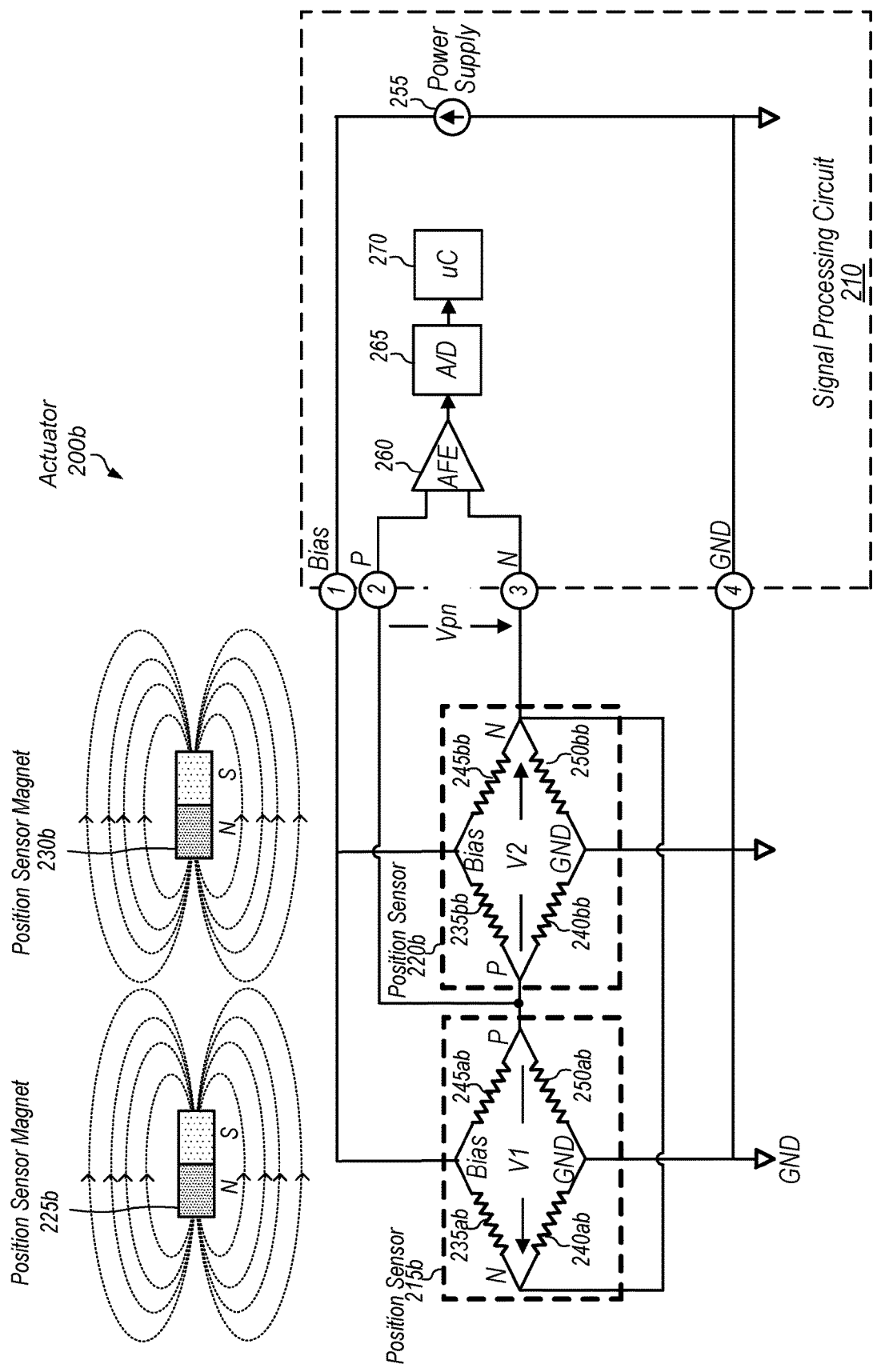
FIG. 2B depicts a schematic diagram of another example measurement circuitry for measuring the autofocus position and/or image sensor position of a camera system, according to some embodiments.

FIG. 2B depicts a schematic diagram of another example measurement circuitry for measuring the autofocus position and/or image sensor position of a camera system, according to some embodiments. In this example, actuator 200b may include a first and a second position sensor magnets 225b and 230b, according to some embodiments. In some embodiments, the actuator 200b may include a first and a second position sensors 215b and 22bb, respectively represented by an equivalent circuit comprising resistance 235ab-250ab and 235bb-250bb. In some embodiments, the first and second position sensors 215b-220b may be positioned proximate the first and second position sensor magnets 225b-230b, respectively, such that the first position sensor 215b may measure predominantly the magnetic field produced by the first position sensor magnet 225b whilst the second position sensor 220b may measure predominantly the magnetic field produced by the first position sensor magnet 230b. In some embodiments, the position sensor magnets 225b-230b may be arranged to provide the magnetic fields with the same polarity detectable by the position sensors 215b-220b. For instance, as shown in FIG. 2B, the first position sensor 215b may detect predominantly the magnetic fluxes from north to south poles of the first position sensor magnet 225b, and the second position sensor 220b may also detect substantially the magnetic fluxes from north to south poles of the second position sensor magnet 230b. Accordingly, the measurement signals v1 and v2 of the position sensors 215b and 220b may have the same polarity. As shown in FIG. 2B, in some embodiments, the position sensors 215b and 220b may be coupled in parallel to produce a combined sensor output vpn that may include an average of the respective sensor signals v1 and v2. As shown in FIG. 2B, the combined sensor output vpn may be provided to signal processing circuit 210 to determine the position information, e.g., the position, distance, and/or angle of the optics assembly and/or the image sensor of the camera, as described above.

Figure 3A:
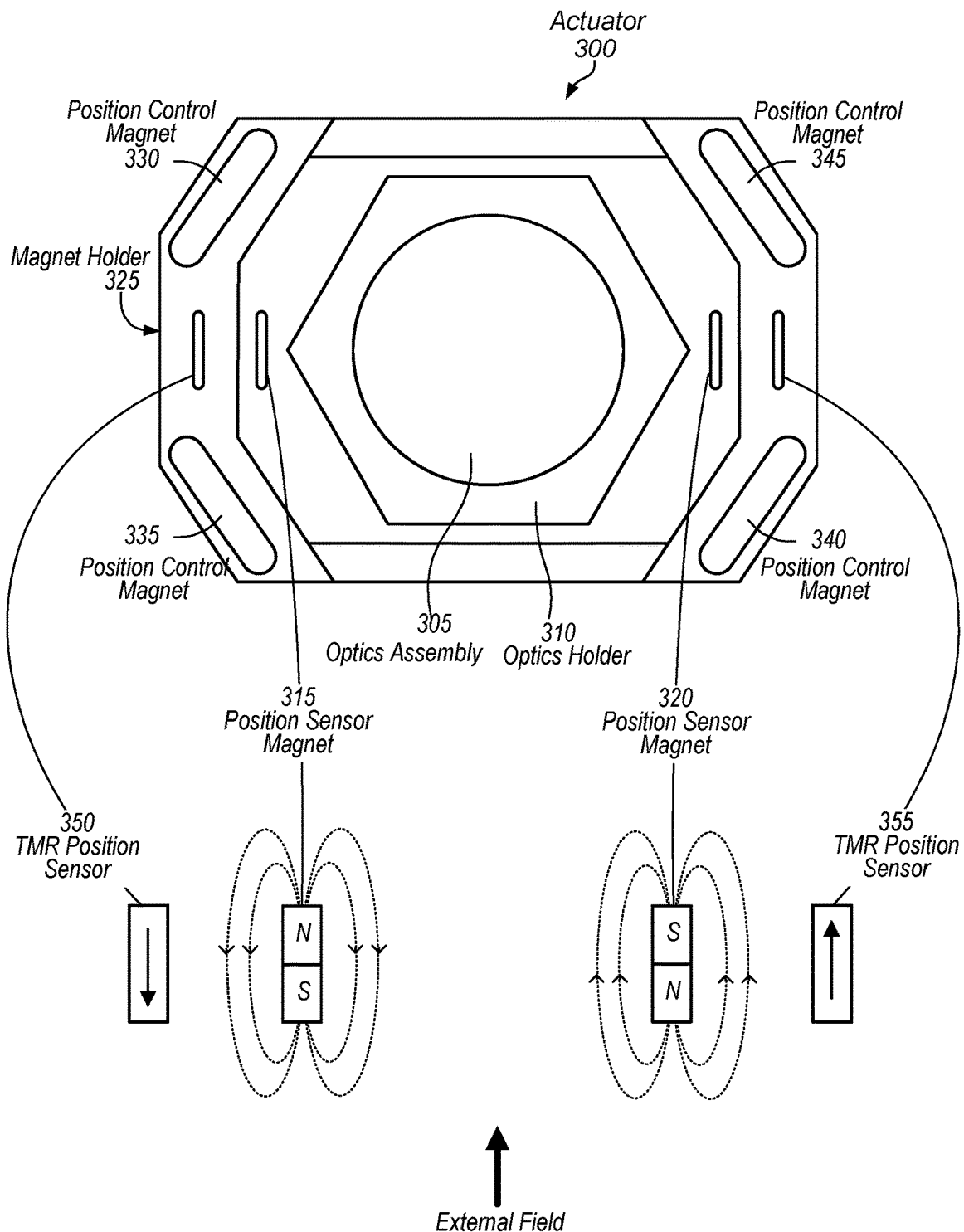
FIG. 3A illustrates a top view of an example embodiment of an actuator of a camera system, according to some embodiments.

FIG. 3A illustrates a top view of an example embodiment of an actuator of a camera system, according to some embodiments. In the example shown in FIG. 3A, the actuator 300 may include an optics assembly 305 that may include one or more flat or curved optic lenses. The optics assembly 305 may be held in an optics holder 310 that also carries position sensor magnets (or probe magnets) 315-320, e.g., to implement autofocus movements of the optics assembly 305. A magnet holder 325 may hold position control magnets 330-345 and position sensors 350-355, which may be any magnetic sensor or other applicable sensor, e.g., tunneling magnetoresistance (TMR) sensors. Simply speaking, a TMR sensor may be viewed as a thin-film component comprising a barrier layer sandwiched between two ferromagnetic layers (a free layer and a pin layer). The magnetization direction of the pin layer may have been fixed, whilst the magnetization direction of the free layer may change according to a triggering magnetic field, e.g., a magnetic field produced by a position sensor magnet. Accordingly, the electrical resistance of the TMR sensor may change along with this change in the free layer. For instance, the electrical resistance may reduce when the magnetization directions of the pin layer and free layer become parallel, causing the TMR sensor to become conductive. When the magnetization directions of the free and pin layers are antiparallel, the resistance may increase, causing the TMR sensor to become insulated. Because the electrical characteristics of the TMR sensor may vary with the triggering magnetic field, the TMR may be used to measure the triggering magnetic field, from which the position information of the corresponding magnet may thus be derived. For instance, the TMR sensor may be combined with one or more other resistors to form a voltage divider. With a bias current applied to the voltage divider including the TMR sensor, the sensor signal, e.g., a voltage across the P-N terminals of the TMR sensor, may be measured as an indication of the position, distance, and/or angle of a position sensor magnet with respect to the TMR sensor. Given the orientation-related characteristics of TMR sensors, the position sensors 350-355 may each have a sensitive direction, as indicated by the arrows in FIG. 3A. When the directions of the magnetic fields from the position sensors 315 and 320 become parallel (or antiparallel) to the sensitive directions of the corresponding position sensors 350-355, the position sensors 350-355 may behave as low-resistance (or high-resistance) components and produce small (or large) sensor signals, e.g., small (or large) voltages across respective P-N terminals. In some embodiments, the actuator 300 may further include position control magnets 330-345. The position control magnets 330-345 may create magnetic fields, which the interior coils (including autofocus coil and/or optical image stabilization coil, not visible in FIG. 3A) of the actuator module 300 may interfere with to produce motive forces (e.g., Lorentz forces) to move the optics assembly 305 or image sensor(s) of the camera system. As the position sensor magnets 315-320 are affixed to the optics holder 310, the position sensor magnets 315-320 may move together with the optics assembly 305 relative to the position sensors 350-355. The position sensor magnets 315-320 may provide magnetic fields, with which the position sensors 350-355 may interfere to produce sensor signals, e.g., output voltage signals, for measuring the position of the optics assembly 305.

In some embodiments, the position sensor magnets 315-320 may provide magnetic fields with the same or different polarities detectable by the position sensors 350 and 355, respectively. For instance, in the example shown in FIG. 3A, the position sensor magnets 315-320 and position sensors 350-355 may be configured such that the sensitive directions of the position sensors 315-320 may become substantially parallel to the magnetic field directions (e.g., the directions of the magnetic fluxes from north to south poles) of the position sensor magnets 315-320. As the position sensor magnets 315-320 move, e.g., with the optics holder 310 along the optical (Z) axis, the magnetic fields of the position sensor magnets 315-320 detectable by the position sensors 350-355 respectively may vary accordingly, and position information, e.g., the distance, position and/or angle, of the position sensor magnets 315-320 may thus be determined, e.g., relative to the position sensors 350-355. In some embodiments, the position sensors 350-355 may be coupled, e.g., with direct or indirect electrical connections, in parallel in the same or reverse directions to produce a combined sensor output. For instance, as described above in FIG. 2B, each of the two position sensors 350-355 may produce a sensor signal from P-N terminals. The two position sensors 350-355 may be coupled in parallel with the P terminal of the position sensor 350 coupled to the P terminal of the position sensor 355 and the N terminal of the position sensor 350 coupled to the N terminal of the position sensor 355 to produce a combined sensor output vpn. This connection may compensate for tilt effects in the sensitive directions of the position sensors 350-355, e.g., the tile of the optics assembly causing different angles for the position sensor magnets 315-320 relative to the respective position sensors 350-355. In some embodiments, the combined sensor output may include an average of the respective sensor signals from the first and second position sensors 350-355. Further, as shown in FIG. 3A, the position sensors 350-355 may be arranged spatially in substantially opposite directions such that the position sensors 350-355 may sense an external field with different polarities. For instance, in this example in FIG. 3A, the external field direction may be antiparallel to the magnetic field direction of the position sensor magnet 315 (and sensitive direction of position sensor 350) but parallel to the magnetic field direction of the position sensor magnet 320 (and sensitive direction of position sensor 350). The external magnetic field may superposition upon the magnetic fields from the position sensor magnets 315-320, such that the total magnetic field detectable by the position sensor 350 may be weakened whilst the total magnetic field seen by the other position sensor 355 may be strengthened. Thus, the sensor signal of position sensors 350 may be reduced and the sensor signal from position sensor 355 may be increased. In combination, the effect of the external magnetic field on the combined sensor output from the position sensors 350-355 may be canceled.

One with ordinary skills in the art shall appreciate that the example in FIG. 3A is merely an example for purposes of illustration. In some embodiments, the camera system may include less or more position sensor magnets 315-320 and less or more position sensors 350-355. Further, when the camera system includes multiple position sensor magnets, such as position sensor magnets 315-320, the position sensor magnets 315-320 may be positioned on the lens holder 310 in different manners. For instance, the position sensor magnets 315-320 may be placed at opposite locations around the optics assembly 305, as shown in FIG. 3A. Alternatively, the position sensor magnets 315-320 may be placed at the same side of the camera system. In some embodiments, the position sensor magnets 315-320 may be placed at diagonally opposite position, like the position control magnets 330 and 340. As the arrangement of the position sensor magnets 315-320 changes, the placement of the position sensors 350-355 may be adjusted accordingly so that the position sensors 350-355 may still measure the magnetic fields of the position sensor magnets 350-355 respectively. In FIG. 3, the position sensor magnets 315-320 are affixed to a moveable part such as the lens holder 310 of the camera system. Thus, the position sensor magnets 315-320 moves relative to stationary position sensors 350-155. In some embodiments, the movability of the position sensor magnet(s) and position sensor(s) may be reversed. For instance, the position sensor magnets 315-320 may be installed on stationary magnet holder 325, whilst the position sensors 350-355 affixed to the dynamic lens holder 310. Besides the various ways to arrange the position sensor magnet(s) and position sensor(s), what is more important is that one component moves relative to the other component such that the varying magnetic field may be measured to determine the position of the moving component. In this example in FIG. 3A, the camera system includes dedicated position sensor magnets 315-320, separate from the position control magnets 330-345. In some embodiments, the camera system may combine the functionalities of the position sensor magnets 315-320 into the position control magnets 330-345, such as using the position control magnets 330-345 also as the probe magnets. Although the above various embodiments are described with respect to the position sensor magnet(s) and position sensor(s) for position measurement of the optics assembly 305, the same applies to the image sensor(s) (not visible in FIG. 3A) of the camera system as well.

Figure 3B:
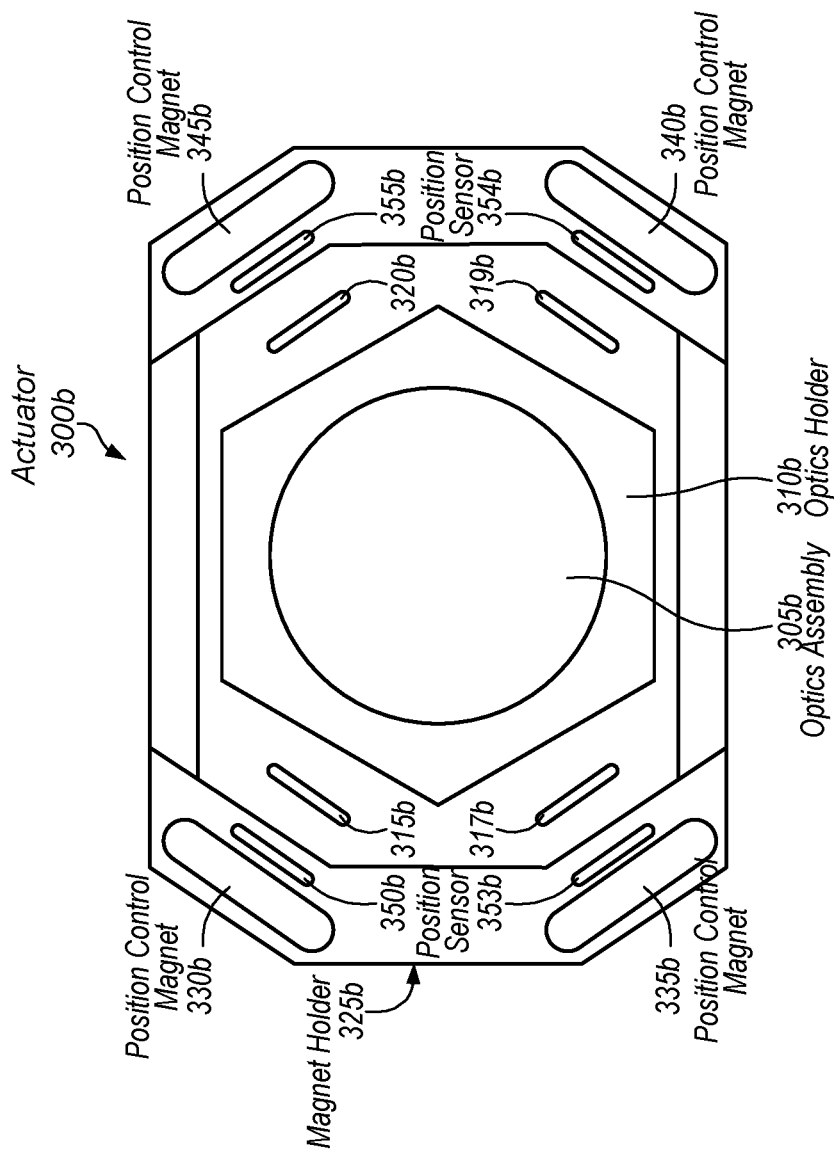
FIG. 3B depicts a top view of another example embodiment of an actuator of a camera system, according to some embodiments.

FIG. 3B depicts a top view of another example embodiment of an actuator of a camera system, according to some embodiments. In this example in FIG. 3B, the actuator 300b may include an optics assembly 305b that may include one or more flat or curved optic lenses. The optics assembly 305b may be held in an optics holder 310b that also carries position sensor magnets (or probe magnets) 315b, 317b, 319b and 320b, e.g., to implement autofocus movements of the optics assembly 305b. A magnet holder 325b may hold position control magnets 330b-345b and position sensors 350b, 353b, 354b and 355b, which may be any magnetic sensor or other applicable sensor, e.g., Hall sensors, tunneling magnetoresistance (TMR) sensors, giant magnetoresistance (GMR) sensors, anisotropic magnetoresistance (AMR), and so on. The position control magnets 330b-345b may create magnetic fields, which the interior coils (not shown, including autofocus coil and/or optical image stabilization coil) of the actuator module 300b may interfere with to produce motive forces (e.g., Lorentz forces) to move the optics assembly 305b or image sensor(s) of the camera system. As the position sensor magnets 315b-320b are affixed to the optics holder 310b, the position sensor magnets 315b-320b may move together with the optics assembly 305b relative to the position sensors 350b-355b. The position sensor magnets 315b-320b may provide magnetic fields, with which the position sensors 350b-355b may interfere to produce sensor signals, e.g., output voltage signals, for measuring the position of the optics assembly 305b. As described above, the position sensor magnets 315b-320b as well as the position sensors 350b-355b may be arranged in various configurations to provide the position measurement for the optics assembly 305b and/or the image sensor(s) of the camera system. For instance, the position sensor magnets 315b and 317b may be arranged to provide magnetic fields of different polarities detectable by position sensors 350b-353b, whilst the 319b and 320b may be arranged to provide magnetic fields of different polarities detectable by position sensors 355b-355b, respectively. The position sensors 350b-353b may be coupled in parallel in reverse directions to produce a combined sensor output for determining the position for the optics assembly 305b on the left side of the camera system, and the position sensors 354b-355b to produce a combined sensor output for determining the position for the optics assembly 305b on the right side of the camera system. In some embodiments, it may be the position sensor magnets 315b and 320b that are arranged to provide different-polarity magnetic fields so that the position sensors 350b and 355b are coupled in parallel in reverse direction. In some embodiments, all of the four position sensors 350b-355b may be coupled in parallel in the same or reverse directions to produce the combined sensor output for position measurement. Again, with multiple position sensor magnets and position sensors, the components may be arranged in various ways. As shown in FIGS. 1-3, a camera or an actuator of a camera may have position sensor magnets and position sensors in various configurations. For example, some position sensors may be arranged spatially in a substantial same direction, the position sensors may detect the magnetic fields from corresponding position sensor magnets with different polarities, and the position sensors may be coupled in parallel in reverse directions to produce a combined sensor output (and cancel the effect of an external magnetic field), according to some embodiments, as described above in FIGS. 1A, 2A. In some embodiments, some position sensors may be arranged spatially in substantial opposite directions, the position sensors may detect the magnetic fields from corresponding position sensor magnets with the same polarity, and the position sensors may be coupled in parallel in the same direction to produce a combined sensor output (and cancel the effect of an external magnetic field), according to some embodiments, as described above in FIGS. 1B, 2B and 3A. Further, regardless of the configurations of the position sensor magnets and position sensors, the combined sensor output may be created in analog circuits, which would reduce the burden and requirement on the digital circuits and associated signal processing, as described above. Note that FIGS. 1-3 are merely examples for purposes of illustration. The camera or the actuator of the camera may employ different kinds of position sensor(s) and position sensor magnet(s) in the same or different configurations, as described above, for measuring different position information, e.g., the position information of the optics assembly (e.g., in autofocus) and the image sensor (e.g., in OIS).

Figure 4:
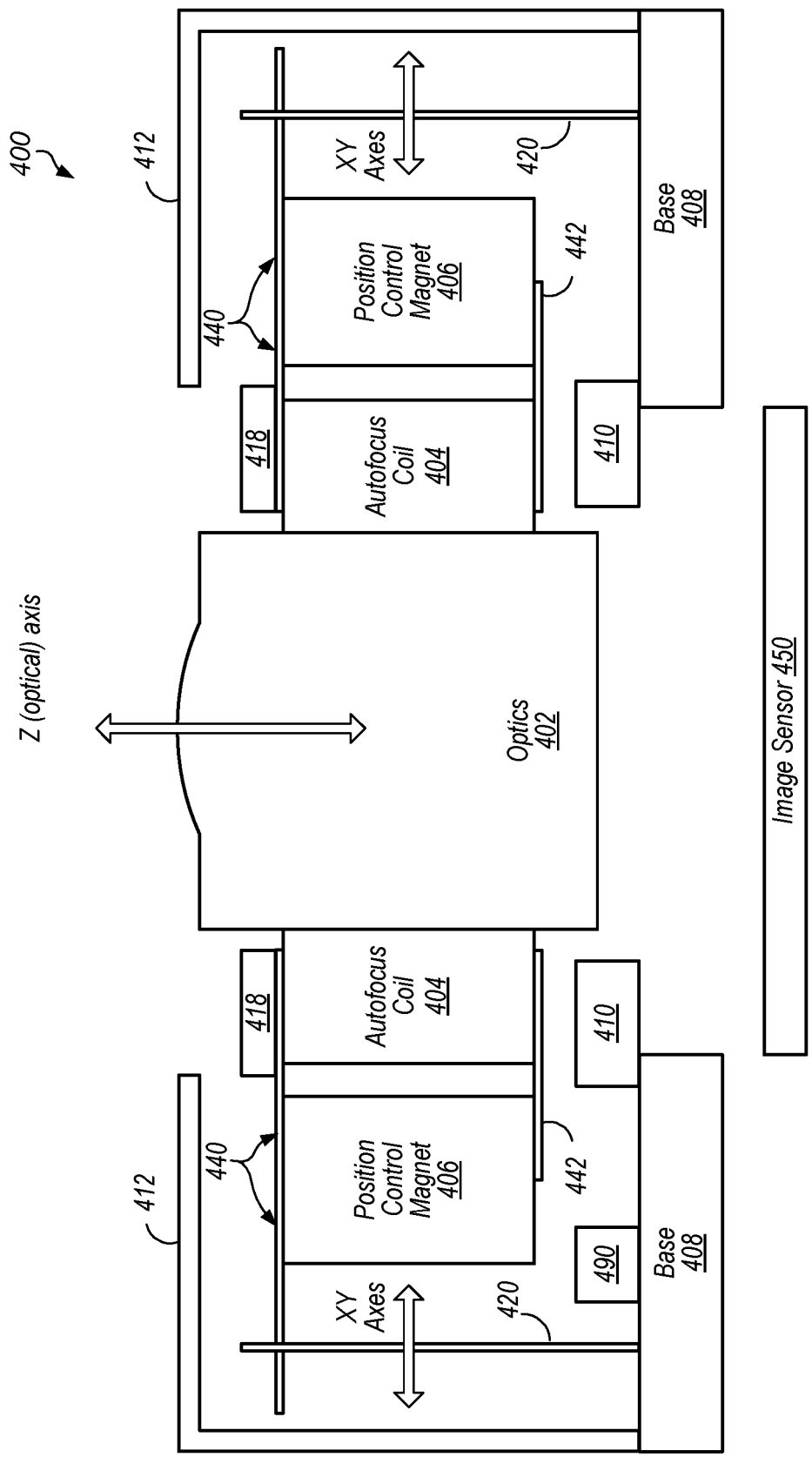
FIG. 4 depicts a side view of an example embodiment of an actuator of a camera system, according to some embodiments.

FIG. 4 depicts a side view of an example embodiment of an actuator of a camera system, according to some embodiments. As shown in FIG. 4, an actuator package 400 may include a base assembly or substrate 408, an optics assembly 402, and a cover 412. Base assembly 408 may include one or more of, but is not limited to, a base 4008, supporting one or more position sensors (e.g., Hall sensors) 410 and suspension wires 420, which enable magnetic sensing for autofocus position detection by detecting movements of position sensor magnets 418. In some embodiments, there are four suspension wires 420. An optics assembly 402 may be suspended on the base assembly 408 by suspension of the upper springs 440 on the suspension wires 420. The actuator 400 may include one or more of, but is not limited to, optics assembly 402, optics holder (autofocus coil) 404, magnet(s) 406, upper spring(s) 430, and lower spring(s) 442. The upper and lower spring(s) may be collectively referred to herein as optics springs. In optics assembly 402, one or more optics components (e.g., a lens or lens assembly) may be screwed, mounted or otherwise held in or by an optics holder (autofocus coil) 404. In some embodiments, the optics assembly 402/optics holder (autofocus coil) assembly 404 may be suspended from or attached to the position control magnets 406 by upper spring(s) 440, and lower spring(s) 442, and the position control magnets 406 may be rigidly mounted to base 408. The upper spring(s) 440 and lower spring(s) 442 may be flexible to allow the optics assembly 404 a range of motion along the Z (optical) axis for optical focusing, and wires 420 may be flexible to allow a range of motion on the XY plane orthogonal to the Z (optical) axis for optical image stabilization. In addition to the position sensor magnets 418 an actuator module 400 as described herein may include one or more position sensor magnets 418 and one or more position control magnets 406. In some embodiments, a package of processors and memory 490 or other computer-readable medium may, in some embodiments, be included in actuator module 400. In some embodiments, a package of processors and memory 490 or other computer-readable medium as described herein may alternatively, in some embodiments, be omitted from actuator module 400 and housed elsewhere in a device in which actuator package 400 is installed. As described above, the measurement of the position for the optics assembly 402 and/or image sensor 450 may be merely one of the early steps in control of the movements of the optics assembly 402 (e.g., in autofocus movements) and/or image sensor 450 (e.g., in OIS movements). Once the position measurement becomes available, the camera system may take the position measurement as a feedback signal and drive the actuator 400 to move and control the positions of the optics assembly 402 and/or the image sensor 450 based on the position measurement feedback. Note that the embodiments illustrated in FIG. 4 is merely one example for purposes of illustration. As described above, the camera system may include more or less position sensor magnets and more or less position sensors for measuring the positions of the optics assembly 402 and/or the image sensor 450. Further, as described above, the position sensor magnets and position sensors may be arranged in various configurations. For instance, in some embodiments, the position sensor magnets may be configured to be moveable (with the optics assembly 402 and/or the image sensor 450) while the position sensors are stationary (with respect to the base 408). In some other embodiments, the position sensor magnets may be stationary (with respect to the base 408) whilst the position sensors are moveable (with the optics assembly 402 and/or the image sensor 450). In some embodiments, the position sensor magnets may be arranged to produce magnetic fields of different polarities detectable by the position sensors. The position sensors may be coupled in parallel in reverse directions to produce a combined sensor output. The camera system may use the combined sensor output to determine the position for the optics assembly 402 and/or the image sensor 450. In some embodiments, the position sensor magnets (and position sensors) may be positioned at or near the same locations or at different places (e.g., diagonally opposite places) around the camera system. In FIG. 4, the optics assembly 402 may be controllably moveable along the Z axis (i.e., autofocus movements) as well as on the XY plane (i.e., OIS movements). In some embodiments, the optics assembly 402 may be controlled to move along the Z axis (i.e., autofocus movements), and the image sensor 450 may be controlled to shift on the XY plane (i.e., OIS movements). For instance, the image sensor 450 may be affixed to a dynamic platform which may be further suspended from the base 408 or other stationary parts of the actuator 400 (e.g., the cover 412) through mechanical flexures, e.g., in the horizontal directions on the XY plane that is orthogonal to the Z axis (i.e., the optical axis) of the optics assembly 402. The flexure may limit but also allow for certain degrees of freedom for the image sensor to move relative to the optics assembly 402 on the XY plane.

Figure 5A:
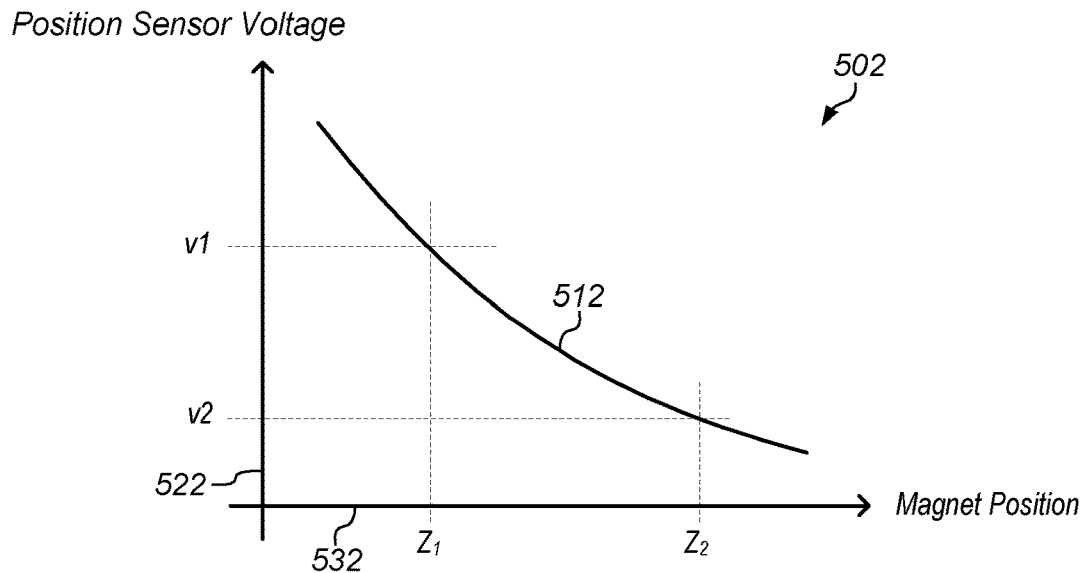
FIG. 5A depicts a plot of a relationship between position sensor voltage and magnet position, according to some embodiments.

FIG. 5A depicts a plot of a relationship between position sensor voltage and magnet position, according to some embodiments. Graph 502 includes a voltage-position curve 512 indicating that position sensor voltage 522 changes as a function of magnet position 532, relative to the sensor. Take the Hall position sensor as an example. The sensor may conduct a constant bias current while exposing to a magnetic field. The magnetic field may create Lorentz forces on the electrons moving through the sensor, such that a difference in electric potential—an output voltage—may develop between the two sides of the sensor. Note that for a range of positions, the position sensor output is approximately linear with magnet position 532.

Figure 5B:
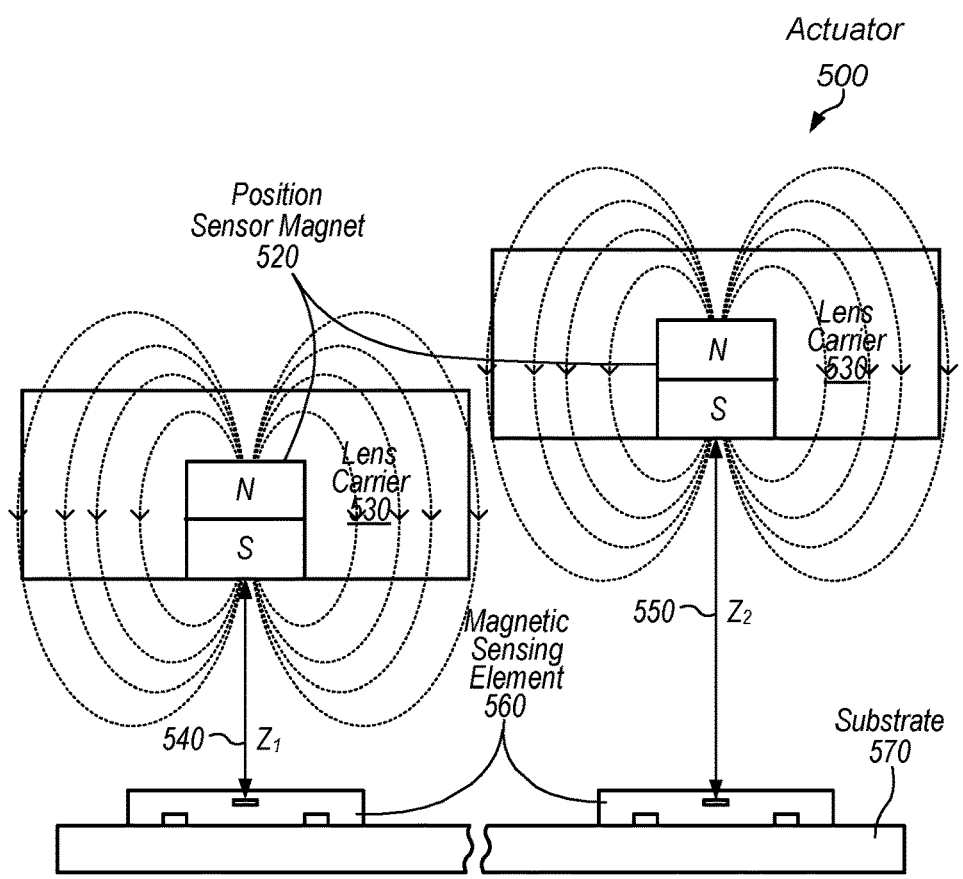
FIG. 5B depicts a schematic view of a position sensor interacting with a magnet to provide magnetic sensing, according to some embodiments.

FIG. 5B illustrates a schematic view of a position sensor interacting with a magnet to provide magnetic sensing, according to some embodiments. A magnetic sensing element 560 (e.g., a Hall sensor) on a substrate 570 may generate a measurement of a magnetic field resulting from the position sensor magnet (or probe magnet) 520. In this example, the position sensor 520 may be fixedly mounted to the camera lens carrier 530 and thus become moveable with the camera lens carrier 530, e.g., in autofocus movements. When the position sensor magnet 520 moves from a closer position Z1 540 to a further position Z2 550, with respect to the magnetic sensing element 560, the magnetic sensing element 560 may produce respective sensor signals, e.g., the position sensor voltages V1 and V2, as shown in FIG. 5A. Because the position sensor 520 moves away from the magnetic sensing element 560, the position sensor voltage becomes smaller, (i.e., v2<v1).

Figure 6:
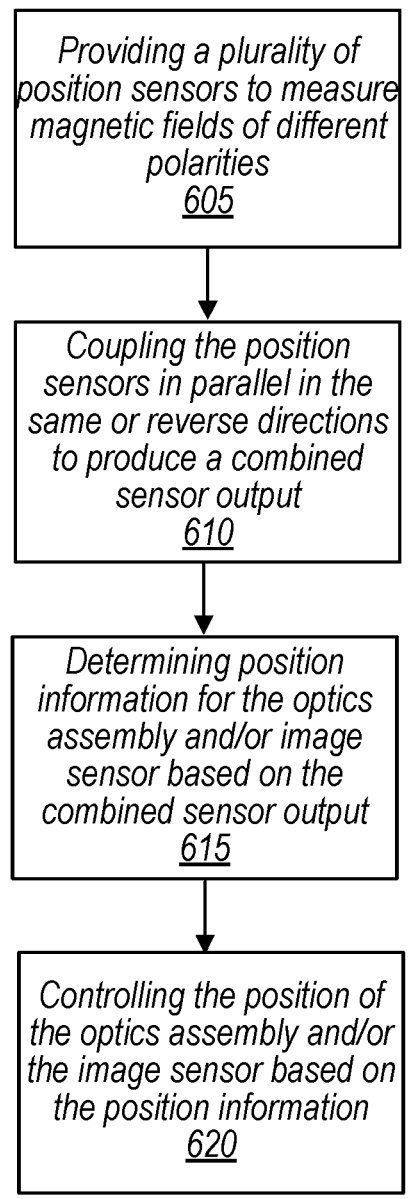
FIG. 6 depicts a flowchart showing the autofocus and/or image sensor position control based on position measurement, according to some embodiments.

FIG. 6 depicts a flowchart showing the autofocus and/or image sensor position control based on position measurement, according to some embodiments. As indicated at 605, a camera system, e.g., the camera system described above in FIGS. 1-5, may provide a plurality of position sensors including a first and a second position sensors, arranged in various (e.g., spatial) configurations, to measure the magnetic fields of different polarities. As described above, e.g., in FIG. 1A-1B, the first and second position sensors 130-135 (or 130-135) may produce sensor signals v1 and v2 corresponding to the measurement of respective magnetic fields produced by the position sensor magnets 120-125 (or 120b-125b), which have different or same polarities. As indicated at 610, the position sensors may be coupled in parallel in reverse or same directions to produce a combined sensor output. For instance, as described above in FIG. 1A-1B, the P terminal of the first position sensor 130 (or 130b) may be coupled to the N (or P) terminal of the second position sensor 135 (or 135b) whilst the N terminal of the first position sensor 130 (or 130b) may be coupled to the P (or N) terminal of the second position sensor 135 (or 135b) to produce the combined sensor output vpn. As indicated at 615, the camera system may determine position information for the optics assembly and/or image sensor, e.g., the autofocus position (e.g., the position of the optics assembly) and/or the image sensor position, based in part on the combined sensor output. As described above in FIG. 1A-1B, the camera system may provide the combined sensor output vpn to the signal processing circuit 510 to determine the autofocus position and/or the image sensor position. As indicated at 620, once the position information, e.g., the autofocus position and/or the image sensor position, becomes available, the camera system may use the position measurement as a feedback signal to control the position of the optics assembly (e.g., in autofocus) and/or the position of the image sensor (e.g., in OIS).

Figure 7:
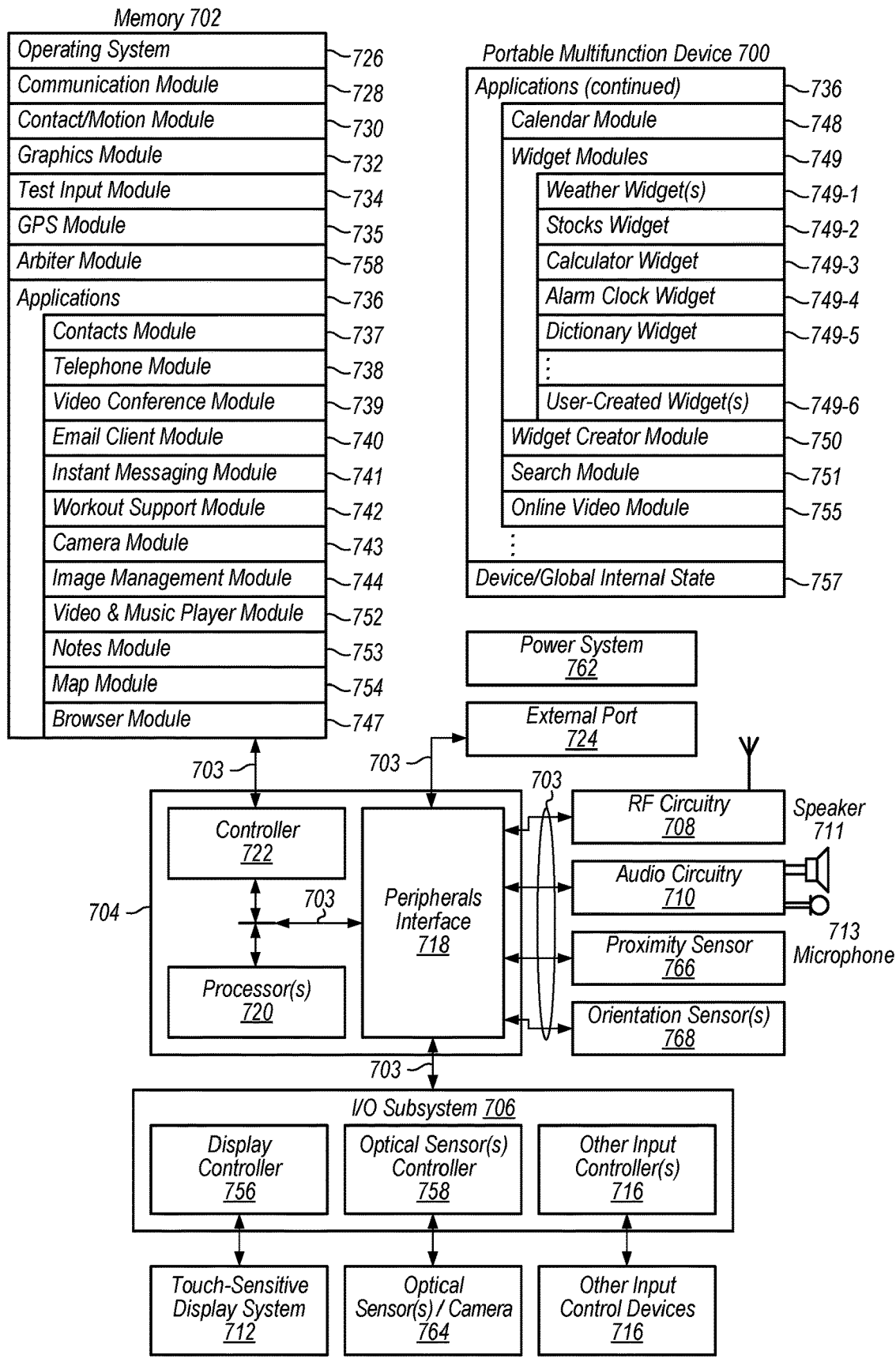
FIG. 7 illustrates a block diagram of a portable multifunction device with a camera system, according to some embodiments.

Attention is now directed toward embodiments of portable devices with cameras. FIG. 7 illustrates a block diagram of an example portable multifunction device 700 that may include a camera system as described above, according to some embodiments. Cameras 764 are sometimes called "optical sensors" for convenience, and may also be known as or called an optical sensor system. Device 700 may include memory 702 (which may include one or more computer readable storage mediums), memory controller 722, one or more processing units (CPUs) 720, peripherals interface 718, RF circuitry 708, audio circuitry 710, speaker 711, touch-sensitive display system 712, microphone 713, input/output (I/O) subsystem 706, other input or control devices 716, and external port 724. Device 700 may include multiple. optical sensors 764. These components may communicate over one or more communication buses or signal lines 703.

It should be appreciated that device 700 is only one example of a portable multifunction device, and that device 700 may have more or fewer components than shown, may combine two or more components, or may have a different configuration or arrangement of the components. The various components shown in FIG. 7 may be implemented in hardware, software, or a combination of hardware and software, including one or more signal processing and/or application specific integrated circuits.

Memory 702 may include high-speed random access memory and may also include non-volatile memory, such as one or more magnetic disk storage devices, flash memory devices, or other non-volatile solid-state memory devices. Access to memory 702 by other components of device 700, such as CPU 720 and the peripherals interface 718, may be controlled by memory controller 722.

Peripherals interface 718 can be used to couple input and output peripherals of the device to CPU 720 and memory 702. The one or more processors 720 run or execute various software programs and/or sets of instructions stored in memory 702 to perform various functions for device 700 and to process data.

In some embodiments, peripherals interface 718, CPU 720, and memory controller 722 may be implemented on a single chip, such as chip 704. In some other embodiments, they may be implemented on separate chips.

RF (radio frequency) circuitry 708 receives and sends RF signals, also called electromagnetic signals. RF circuitry 708 converts electrical signals to/from electromagnetic signals and communicates with communications networks and other communications devices via the electromagnetic signals. RF circuitry 708 may include well-known circuitry for performing these functions, including but not limited to an antenna system, an RF transceiver, one or more amplifiers, a tuner, one or more oscillators, a digital signal processor, a CODEC chipset, a subscriber identity module (SIM) card, memory, and so forth. RF circuitry 708 may communicate with networks, such as the Internet, also referred to as the World Wide Web (WWW), an intranet and/or a wireless network, such as a cellular telephone network, a wireless local area network (LAN) and/or a metropolitan area network (MAN), and other devices by wireless communication. The wireless communication may use any of a variety of communications standards, protocols and technologies, including but not limited to Global System for Mobile Communications (GSM), Enhanced Data GSM Environment (EDGE), high-speed downlink packet access (HSDPA), high-speed uplink packet access (HSUPA), wideband code division multiple access (W-CDMA), code division multiple access (CDMA), time division multiple access (TDMA), Bluetooth, Wireless Fidelity (Wi-Fi) (e.g., IEEE 702.11a, IEEE 702.11b, IEEE 702.11g and/or IEEE 702.11n), voice over Internet Protocol (VoIP), Wi-MAX, a protocol for e-mail (e.g., Internet message access protocol (IMAP) and/or post office protocol (POP)), instant messaging (e.g., extensible messaging and presence protocol (XMPP), Session Initiation Protocol for Instant Messaging and Presence Leveraging Extensions (SIMPLE), Instant Messaging and Presence Service (IMPS)), and/or Short Message Service (SMS), or any other suitable communication protocol, including communication protocols not yet developed as of the filing date of this document.

Audio circuitry 710, speaker 711, and microphone 713 provide an audio interface between a user and device 700. Audio circuitry 710 receives audio data from peripherals interface 718, converts the audio data to an electrical signal, and transmits the electrical signal to speaker 711. Speaker 711 converts the electrical signal to human-audible sound waves. Audio circuitry 710 also receives electrical signals converted by microphone 713 from sound waves. Audio circuitry 710 converts the electrical signal to audio data and transmits the audio data to peripherals interface 718 for processing. Audio data may be retrieved from and/or transmitted to memory 702 and/or RF circuitry 708 by peripherals interface 718. In some embodiments, audio circuitry 710 also includes a headset jack (e.g., 812, FIG. 8). The headset jack provides an interface between audio circuitry 710 and removable audio input/output peripherals, such as output-only headphones or a headset with both output (e.g., a headphone for one or both ears) and input (e.g., a microphone).

I/O subsystem 706 couples input/output peripherals on device 700, such as touch screen 712 and other input control devices 716, to peripherals interface 718. I/O subsystem 706 may include display controller 756 and one or more input controllers 760 for other input or control devices. The one or more input controllers 760 receive/send electrical signals from/to other input or control devices 716. The other input control devices 716 may include physical buttons (e.g., push buttons, rocker buttons, etc.), dials, slider switches, joysticks, click wheels, and so forth. In some alternate embodiments, input controller(s) 760 may be coupled to any (or none) of the following: a keyboard, infrared port, USB port, and a pointer device such as a mouse. The one or more buttons (e.g., 808, FIG. 8) may include an up/down button for volume control of speaker 711 and/or microphone 713. The one or more buttons may include a push button (e.g., 806, FIG. 8).

Touch-sensitive display 712 provides an input interface and an output interface between the device and a user. Display controller 756 receives and/or sends electrical signals from/to touch screen 712. Touch screen 712 displays visual output to the user. The visual output may include graphics, text, icons, video, and any combination thereof (collectively termed "graphics"). In some embodiments, some or all of the visual output may correspond to user-interface objects.

Touch screen 712 has a touch-sensitive surface, sensor or set of sensors that accepts input from the user based on haptic and/or tactile contact. Touch screen 712 and display controller 756 (along with any associated modules and/or sets of instructions in memory 702) detect contact (and any movement or breaking of the contact) on touch screen 712 and converts the detected contact into interaction with user-interface objects (e.g., one or more soft keys, icons, web pages or images) that are displayed on touch screen 712. In an example embodiment, a point of contact between touch screen 712 and the user corresponds to a finger of the user.

Touch screen 712 may use LCD (liquid crystal display) technology, LPD (light emitting polymer display) technology, or LED (light emitting diode) technology, although other display technologies may be used in other embodiments. Touch screen 712 and display controller 756 may detect contact and any movement or breaking thereof using any of a variety of touch sensing technologies now known or later developed, including but not limited to capacitive, resistive, infrared, and surface acoustic wave technologies, as well as other proximity sensor arrays or other elements for determining one or more points of contact with touch screen 712. In an example embodiment, projected mutual capacitance sensing technology is used, such as that found in the iPhone®, iPod Touch®, and iPad® from Apple Inc. of Cupertino, Calif.

Touch screen 712 may have a video resolution in excess of 700 dpi. In some embodiments, the touch screen has a video resolution of approximately 760 dpi. The user may make contact with touch screen 712 using any suitable object or appendage, such as a stylus, a finger, and so forth. In some embodiments, the user interface is designed to work primarily with finger-based contacts and gestures, which can be less precise than stylus-based input due to the larger area of contact of a finger on the touch screen. In some embodiments, the device translates the rough finger-based input into a precise pointer/cursor position or command for performing the actions desired by the user.

In some embodiments, in addition to the touch screen, device 700 may include a touchpad (not shown) for activating or deactivating particular functions. In some embodiments, the touchpad is a touch-sensitive area of the device that, unlike the touch screen, does not display visual output. The touchpad may be a touch-sensitive surface that is separate from touch screen 712 or an extension of the touch-sensitive surface formed by the touch screen.

Device 700 also includes power system 762 for powering the various components. Power system 762 may include a power management system, one or more power sources (e.g., battery, alternating current (AC)), a recharging system, a power failure detection circuit, a power converter or inverter, a power status indicator (e.g., a light-emitting diode (LED)) and any other components associated with the generation, management and distribution of power in portable devices.

Device 700 may also include one or more optical sensors or cameras 764. FIG. 7 shows an optical sensor 764 coupled to optical sensor controller 758 in I/O subsystem 706. Optical sensor 764 may include charge-coupled device (CCD) or complementary metal-oxide semiconductor (CMOS) phototransistors. Optical sensor 764 receives light from the environment, projected through one or more lens, and converts the light to data representing an image. In conjunction with imaging module 743 (also called a camera module), optical sensor 764 may capture still images or video. In some embodiments, an optical sensor 764 is located on the back of device 700, opposite touch screen display 712 on the front of the device, so that the touch screen display 712 may be used as a viewfinder for still and/or video image acquisition. In some embodiments, another optical sensor is located on the front of the device so that the user's image may be obtained for videoconferencing while the user views the other video conference participants on the touch screen display.

Device 700 may also include one or more proximity sensors 766. FIG. 7 shows proximity sensor 766 coupled to peripherals interface 718. Alternately, proximity sensor 766 may be coupled to input controller 760 in I/O subsystem 706. In some embodiments, the proximity sensor 766 turns off and disables touch screen 712 when the multifunction device 700 is placed near the user's ear (e.g., when the user is making a phone call).

Device 700 includes one or more orientation sensors 768. In some embodiments, the one or more orientation sensors 768 include one or more accelerometers (e.g., one or more linear accelerometers and/or one or more rotational accelerometers). In some embodiments, the one or more orientation sensors 768 include one or more gyroscopes. In some embodiments, the one or more orientation sensors 768 include one or more magnetometers. In some embodiments, the one or more orientation sensors 768 include one or more of global positioning system (GPS), Global Navigation Satellite System (GLONASS), and/or other global navigation system receivers. The GPS, GLONASS, and/or other global navigation system receivers may be used for obtaining information concerning the location and orientation (e.g., portrait or landscape) of device 700. In some embodiments, the one or more orientation sensors 768 include any combination of orientation/rotation sensors. FIG. 7 shows the one or more orientation sensors 768 coupled to peripherals interface 718. Alternately, the one or more orientation sensors 768 may be coupled to an input controller 760 in I/O subsystem 706. In some embodiments, information is displayed on the touch screen display 712 in a portrait view or a landscape view based on an analysis of data received from the one or more orientation sensors 768.

In some embodiments, the software components stored in memory 702 include operating system 726, communication module (or set of instructions) 728, contact/motion module (or set of instructions) 730, graphics module (or set of instructions) 732, text input module (or set of instructions) 734, Global Positioning System (GPS) module (or set of instructions) 735, arbiter module 758 and applications (or sets of instructions) 736. Furthermore, in some embodiments memory 702 stores device/global internal state 757. Device/global internal state 757 includes one or more of: active application state, indicating which applications, if any, are currently active; display state, indicating what applications, views or other information occupy various regions of touch screen display 712; sensor state, including information obtained from the device's various sensors and input control devices 716; and location information concerning the device's location and/or attitude.

Operating system 726 (e.g., Darwin, RTXC, LINUX, UNIX, OS X, WINDOWS, or an embedded operating system such as VxWorks) includes various software components and/or drivers for controlling and managing general system tasks (e.g., memory management, storage device control, power management, etc.) and facilitates communication between various hardware and software components.

Communication module 728 facilitates communication with other devices over one or more external ports 724 and also includes various software components for handling data received by RF circuitry 708 and/or external port 724. External port 724 (e.g., Universal Serial Bus (USB), FIRE-WIRE, etc.) is adapted for coupling directly to other devices or indirectly over a network (e.g., the Internet, wireless LAN, etc.). In some embodiments, the external port is a multi-pin (e.g., 30-pin) connector.

Contact/motion module 730 may detect contact with touch screen 712 (in conjunction with display controller 756) and other touch sensitive devices (e.g., a touchpad or physical click wheel). Contact/motion module 730 includes various software components for performing various operations related to detection of contact, such as determining if contact has occurred (e.g., detecting a finger-down event), determining if there is movement of the contact and tracking the movement across the touch-sensitive surface (e.g., detecting one or more finger-dragging events), and determining if the contact has ceased (e.g., detecting a finger-up event or a break in contact). Contact/motion module 730 receives contact data from the touch-sensitive surface. Determining movement of the point of contact, which is represented by a series of contact data, may include determining speed (magnitude), velocity (magnitude and direction), and/or an acceleration (a change in magnitude and/or direction) of the point of contact. These operations may be applied to single contacts (e.g., one finger contacts) or to multiple simultaneous contacts (e.g., "multitouch"/multiple finger contacts). In some embodiments, contact/motion module 730 and display controller 756 detect contact on a touchpad.

Contact/motion module 730 may detect a gesture input by a user. Different gestures on the touch-sensitive surface have different contact patterns. Thus, a gesture may be detected by detecting a particular contact pattern. For example, detecting a finger tap gesture includes detecting a finger-down event followed by detecting a finger-up (lift off) event at the same position (or substantially the same position) as the finger-down event (e.g., at the position of an icon). As another example, detecting a finger swipe gesture on the touch-sensitive surface includes detecting a finger-down event followed by detecting one or more finger-dragging events, and subsequently followed by detecting a finger-up (lift off) event.

Graphics module 732 includes various known software components for rendering and displaying graphics on touch screen 712 or other display, including components for changing the intensity of graphics that are displayed. As used herein, the term "graphics" includes any object that can be displayed to a user, including without limitation text, web pages, icons (such as user-interface objects including soft keys), digital images, videos, animations and the like.

In some embodiments, graphics module 732 stores data representing graphics to be used. Each graphic may be assigned a corresponding code. Graphics module 732 receives, from applications etc., one or more codes specifying graphics to be displayed along with, if necessary, coordinate data and other graphic property data, and then generates screen image data to output to display controller 756.

Text input module 734, which may be a component of graphics module 732, provides soft keyboards for entering text in various applications (e.g., contacts 737, e-mail 740, IM 741, browser 747, and any other application that needs text input).

GPS module 735 determines the location of the device and provides this information for use in various applications (e.g., to telephone 738 for use in location-based dialing, to camera 743 as picture/video metadata, and to applications that provide location-based services such as weather widgets, local yellow page widgets, and map/navigation widgets).

Applications 736 may include the following modules (or sets of instructions), or a subset or superset thereof:
- contacts module 737 (sometimes called an address book or contact list);
- telephone module 738;
- video conferencing module 739;
- e-mail client module 740;
- instant messaging (IM) module 741;
- workout support module 742;
- camera module 743 for still and/or video images;
- image management module 744;
- browser module 747;
- calendar module 748;
- widget modules 749, which may include one or more of: weather widget 749-1, stocks widget 749-2, calculator widget 749-3, alarm clock widget 749-4, dictionary widget 749-5, and other widgets obtained by the user, as well as user-created widgets 749-6;
- widget creator module 750 for making user-created widgets 749-6;
- search module 751;
- video and music player module 752, which may be made up of a video player module and a music player module;
- notes module 753;
- map module 754; and/or
- online video module 755.

Examples of other applications 736 that may be stored in memory 702 include other word processing applications, other image editing applications, drawing applications, presentation applications, JAVA-enabled applications, encryption, digital rights management, voice recognition, and voice replication.

In conjunction with touch screen 712, display controller 756, contact module 730, graphics module 732, and text input module 734, contacts module 737 may be used to manage an address book or contact list (e.g., stored in application internal state 757), including: adding name(s) to the address book; deleting name(s) from the address book; associating telephone number(s), e-mail address(es), physical address(es) or other information with a name; associating an image with a name; categorizing and sorting names; providing telephone numbers or e-mail addresses to initiate and/or facilitate communications by telephone 738, video conference 739, e-mail 740, or IM 741; and so forth.

In conjunction with RF circuitry 708, audio circuitry 710, speaker 711, microphone 713, touch screen 712, display controller 756, contact module 730, graphics module 732, and text input module 734, telephone module 738 may be used to enter a sequence of characters corresponding to a telephone number, access one or more telephone numbers in address book 737, modify a telephone number that has been entered, dial a respective telephone number, conduct a conversation and disconnect or hang up when the conversation is completed. As noted above, the wireless communication may use any of a variety of communications standards, protocols and technologies.

In conjunction with RF circuitry 708, audio circuitry 710, speaker 711, microphone 713, touch screen 712, display controller 756, optical sensor 764, optical sensor controller 758, contact module 730, graphics module 732, text input module 734, contact list 737, and telephone module 738, videoconferencing module 739 includes executable instructions to initiate, conduct, and terminate a video conference between a user and one or more other participants in accordance with user instructions.

In conjunction with RF circuitry 708, touch screen 712, display controller 756, contact module 730, graphics module 732, and text input module 734, e-mail client module 740 includes executable instructions to create, send, receive, and manage e-mail in response to user instructions. In conjunction with image management module 744, e-mail client module 740 makes it very easy to create and send e-mails with still or video images taken with camera module 743.

In conjunction with RF circuitry 708, touch screen 712, display controller 756, contact module 730, graphics module 732, and text input module 734, the instant messaging module 741 includes executable instructions to enter a sequence of characters corresponding to an instant message, to modify previously entered characters, to transmit a respective instant message (for example, using a Short Message Service (SMS) or Multimedia Message Service (MMS) protocol for telephony-based instant messages or using XMPP, SIMPLE, or IMPS for Internet-based instant messages), to receive instant messages and to view received instant messages. In some embodiments, transmitted and/or received instant messages may include graphics, photos, audio files, video files and/or other attachments as are supported in a MMS and/or an Enhanced Messaging Service (EMS). As used herein, "instant messaging" refers to both telephony-based messages (e.g., messages sent using SMS or MMS) and Internet-based messages (e.g., messages sent using XMPP, SIMPLE, or IMPS).

In conjunction with RF circuitry 708, touch screen 712, display controller 756, contact module 730, graphics module 732, text input module 734, GPS module 735, map module 754, and music player module 746, workout support module 742 includes executable instructions to create workouts (e.g., with time, distance, and/or calorie burning goals); communicate with workout sensors (sports devices); receive workout sensor data; calibrate sensors used to monitor a workout; select and play music for a workout; and display, store and transmit workout data.

In conjunction with touch screen 712, display controller 756, optical sensor(s) 764, optical sensor controller 758, contact module 730, graphics module 732, and image management module 744, camera module 743 includes executable instructions to capture still images or video (including a video stream) and store them into memory 702, modify characteristics of a still image or video, or delete a still image or video from memory 702.

In conjunction with touch screen 712, display controller 756, contact module 730, graphics module 732, text input module 734, and camera module 743, image management module 744 includes executable instructions to arrange, modify (e.g., edit), or otherwise manipulate, label, delete, present (e.g., in a digital slide show or album), and store still and/or video images.

In conjunction with RF circuitry 708, touch screen 712, display system controller 756, contact module 730, graphics module 732, and text input module 734, browser module 747 includes executable instructions to browse the Internet in accordance with user instructions, including searching, linking to, receiving, and displaying web pages or portions thereof, as well as attachments and other files linked to web pages.

In conjunction with RF circuitry 708, touch screen 712, display system controller 756, contact module 730, graphics module 732, text input module 734, e-mail client module 740, and browser module 747, calendar module 748 includes executable instructions to create, display, modify, and store calendars and data associated with calendars (e.g., calendar entries, to do lists, etc.) in accordance with user instructions.

In conjunction with RF circuitry 708, touch screen 712, display system controller 756, contact module 730, graphics module 732, text input module 734, and browser module 747, widget modules 749 are mini-applications that may be downloaded and used by a user (e.g., weather widget 749-1, stocks widget 749-2, calculator widget 749-3, alarm clock widget 749-4, and dictionary widget 749-5) or created by the user (e.g., user-created widget 749-6). In some embodiments, a widget includes an HTML (Hypertext Markup Language) file, a CSS (Cascading Style Sheets) file, and a JavaScript file. In some embodiments, a widget includes an XML (Extensible Markup Language) file and a JavaScript file (e.g., Yahoo! Widgets).

In conjunction with RF circuitry 708, touch screen 712, display system controller 756, contact module 730, graphics module 732, text input module 734, and browser module 747, the widget creator module 750 may be used by a user to create widgets (e.g., turning a user-specified portion of a web page into a widget).

In conjunction with touch screen 712, display system controller 756, contact module 730, graphics module 732, and text input module 734, search module 751 includes executable instructions to search for text, music, sound, image, video, and/or other files in memory 702 that match one or more search criteria (e.g., one or more user-specified search terms) in accordance with user instructions.

In conjunction with touch screen 712, display system controller 756, contact module 730, graphics module 732, audio circuitry 710, speaker 711, RF circuitry 708, and browser module 747, video and music player module 752 includes executable instructions that allow the user to download and play back recorded music and other sound files stored in one or more file formats, such as MP3 or AAC files, and executable instructions to display, present or otherwise play back videos (e.g., on touch screen 712 or on an external, connected display via external port 724). In some embodiments, device 700 may include the functionality of an MP3 player.

In conjunction with touch screen 712, display controller 756, contact module 730, graphics module 732, and text input module 734, notes module 753 includes executable instructions to create and manage notes, to do lists, and the like in accordance with user instructions.

In conjunction with RF circuitry 708, touch screen 712, display system controller 756, contact module 730, graphics module 732, text input module 734, GPS module 735, and browser module 747, map module 754 may be used to receive, display, modify, and store maps and data associated with maps (e.g., driving directions; data on stores and other points of interest at or near a particular location; and other location-based data) in accordance with user instructions.

In conjunction with touch screen 712, display system controller 756, contact module 730, graphics module 732, audio circuitry 710, speaker 711, RF circuitry 708, text input module 734, e-mail client module 740, and browser module 747, online video module 755 includes instructions that allow the user to access, browse, receive (e.g., by streaming and/or download), play back (e.g., on the touch screen or on an external, connected display via external port 724), send an e-mail with a link to a particular online video, and otherwise manage online videos in one or more file formats, such as H.264. In some embodiments, instant messaging module 741, rather than e-mail client module 740, is used to send a link to a particular online video.

Each of the above identified modules and applications correspond to a set of executable instructions for performing one or more functions described above and the methods described in this application (e.g., the computer-implemented methods and other information processing methods described herein). These modules (i.e., sets of instructions) need not be implemented as separate software programs, procedures or modules, and thus various subsets of these modules may be combined or otherwise re-arranged in various embodiments. In some embodiments, memory 702 may store a subset of the modules and data structures identified above. Furthermore, memory 702 may store additional modules and data structures not described above.

In some embodiments, device 700 is a device where operation of a predefined set of functions on the device is performed exclusively through a touch screen and/or a touchpad. By using a touch screen and/or a touchpad as the primary input control device for operation of device 700, the number of physical input control devices (such as push buttons, dials, and the like) on device 700 may be reduced.

The predefined set of functions that may be performed exclusively through a touch screen and/or a touchpad include navigation between user interfaces. In some embodiments, the touchpad, when touched by the user, navigates device 700 to a main, home, or root menu from any user interface that may be displayed on device 700. In such embodiments, the touchpad may be referred to as a "menu button." In some other embodiments, the menu button may be a physical push button or other physical input control device instead of a touchpad.

Figure 8:
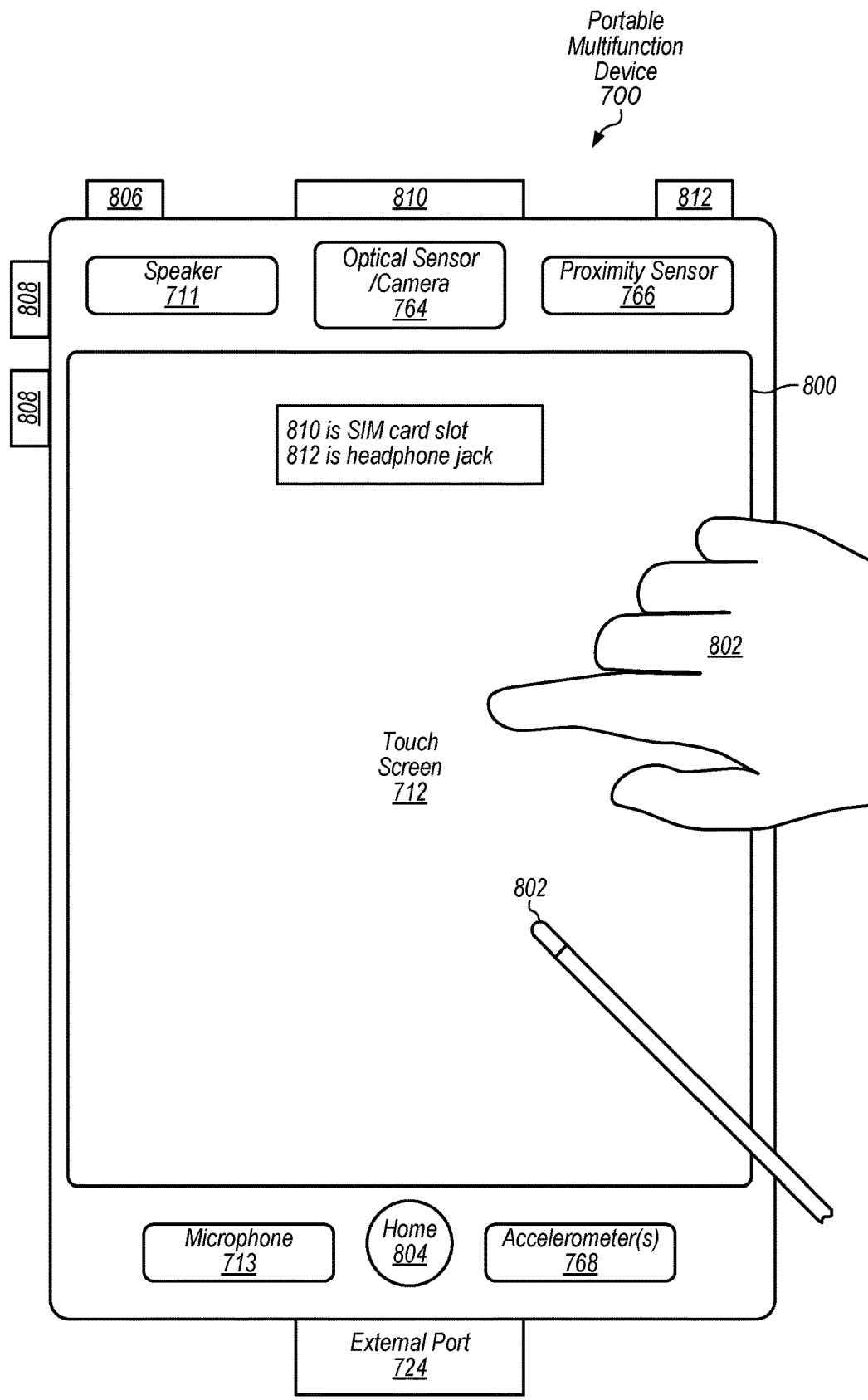
FIG. 8 depicts a portable multifunction device having a camera system, according to some embodiments.

FIG. 8 depicts illustrates an example portable multifunction device 700 that may include a camera system as described above, according to some embodiments. The device 700 may have a touch screen 712. The touch screen 712 may display one or more graphics within user interface (UI) 800. In this embodiment, as well as others described below, a user may select one or more of the graphics by making a gesture on the graphics, for example, with one or more fingers 802. (not drawn to scale in the figure) or one or more styluses 803 (not drawn to scale in the figure).

Device 700 may also include one or more physical buttons, such as "home" or menu button 804. As described previously, menu button 804 may be used to navigate to any application 736 in a set of applications that may be executed on device 700. Alternatively, in some embodiments, the menu button 804 is implemented as a soft key in a GUI displayed on touch screen 712.

In one embodiment, device 700 includes touch screen 712, menu button 804, push button 806 for powering the device on/off and locking the device, volume adjustment button(s) 808, Subscriber Identity Module (SIM) card slot 810, head set jack 812, and docking/charging external port 824. Push button 806 may be used to turn the power on/off on the device by depressing the button and holding the button in the depressed state for a predefined time interval; to lock the device by depressing the button and releasing the button before the predefined time interval has elapsed; and/or to unlock the device or initiate an unlock process. In an alternative embodiment, device 700 also may accept verbal input for activation or deactivation of some functions through microphone 713.

It should be noted that, although many of the examples herein are given with reference to optical sensor(s)/camera(s) 764 (on the front of a device), one or more rear-facing cameras or optical sensors that are pointed opposite from the display may be used instead of, or in addition to, an optical sensor(s)/camera(s) 764 on the front of a device.

Example Computer System

Figure 9:
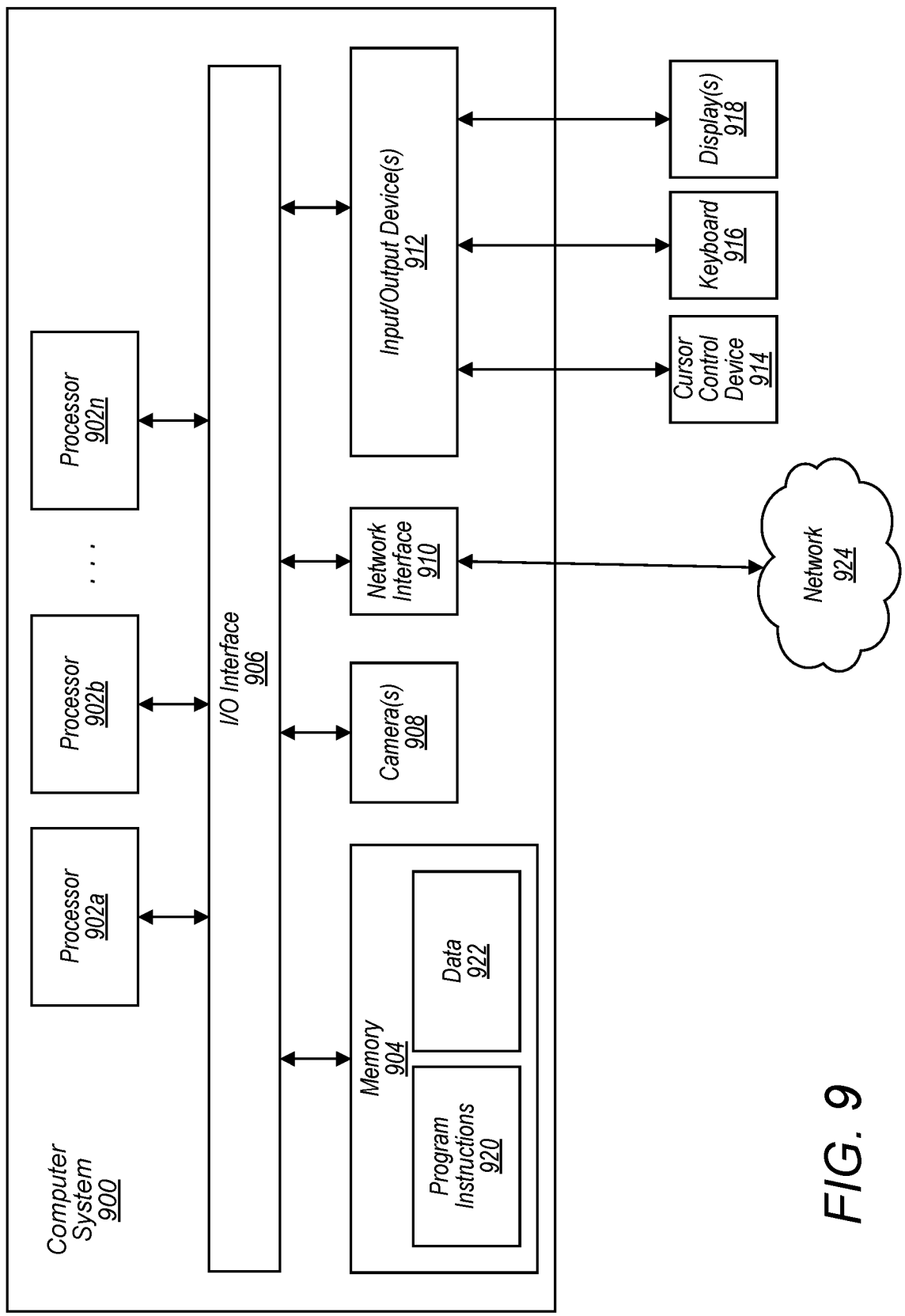
FIG. 9 illustrates an example computer system that may include a camera system, according to some embodiments.

FIG. 9 illustrates an example computing device, referred to as computer system 900, that may include or host embodiments of a camera system as described above with reference to FIGS. 1-8. In addition, computer system 900 may implement methods for controlling operations of the camera and/or for performing image processing images captured with the camera.

The computer system 900 may be configured to execute any or all of the embodiments described above. In different embodiments, computer system 900 may be any of various types of devices, including, but not limited to, a personal computer system, desktop computer, laptop, notebook, tablet, slate, pad, or netbook computer, mainframe computer system, handheld computer, workstation, network computer, a camera, a set top box, a mobile device, an augmented reality (AR) and/or virtual reality (VR) headset, a consumer device, video game console, handheld video game device, application server, storage device, a television, a video recording device, a peripheral device such as a switch, modem, router, or in general any type of computing or electronic device.

In the illustrated embodiment, computer system 900 includes one or more processors 902 coupled to a system memory 904 via an input/output (I/O) interface 906. Computer system 900 further includes one or more cameras 908 coupled to the I/O interface 906. Computer system 900 further includes a network interface 910 coupled to I/O interface 906, and one or more input/output devices 912, such as cursor control device 914, keyboard 916, and display(s) 918. In some cases, it is contemplated that embodiments may be implemented using a single instance of computer system 900, while in other embodiments multiple such systems, or multiple nodes making up computer system 900, may be configured to host different portions or instances of embodiments. For example, in one embodiment some elements may be implemented via one or more nodes of computer system 900 that are distinct from those nodes implementing other elements.

In various embodiments, computer system 900 may be a uniprocessor system including one processor 902, or a multiprocessor system including several processors 902 (e.g., two, four, eight, or another suitable number). Processors 902 may be any suitable processor capable of executing instructions. For example, in various embodiments processors 902 may be general-purpose or embedded processors implementing any of a variety of instruction set architectures (ISAs), such as the x86, PowerPC, SPARC, or MIPS ISAs, or any other suitable ISA. In multiprocessor systems, each of processors 902 may commonly, but not necessarily, implement the same ISA.

System memory 904 may be configured to store program instructions 920 accessible by processor 902. In various embodiments, system memory 904 may be implemented using any suitable memory technology, such as static random access memory (SRAM), synchronous dynamic RAM (SDRAM), nonvolatile/Flash-type memory, or any other type of memory. Additionally, existing camera control data 922 of memory 904 may include any of the information or data structures described above. In some embodiments, program instructions 920 and/or data 922 may be received, sent or stored upon different types of computer-accessible media or on similar media separate from system memory 904 or computer system 900. In various embodiments, some or all of the functionality described herein may be implemented via such a computer system 900.

In one embodiment, I/O interface 906 may be configured to coordinate I/O traffic between processor 902, system memory 904, and any peripheral devices in the device, including network interface 910 or other peripheral interfaces, such as input/output devices 912. In some embodiments, I/O interface 906 may perform any necessary protocol, timing or other data transformations to convert data signals from one component (e.g., system memory 904) into a format suitable for use by another component (e.g., processor 902). In some embodiments, I/O interface 906 may include support for devices attached through various types of peripheral buses, such as a variant of the Peripheral Component Interconnect (PCI) bus standard or the Universal Serial Bus (USB) standard, for example. In some embodiments, the function of I/O interface 906 may be split into two or more separate components, such as a north bridge and a south bridge, for example. Also, in some embodiments some or all of the functionality of I/O interface 906, such as an interface to system memory 904, may be incorporated directly into processor 902.

Network interface 910 may be configured to allow data to be exchanged between computer system 900 and other devices attached to a network 924 (e.g., carrier or agent devices) or between nodes of computer system 900. Network 924 may in various embodiments include one or more networks including but not limited to Local Area Networks (LANs) (e.g., an Ethernet or corporate network), Wide Area Networks (WANs) (e.g., the Internet), wireless data networks, some other electronic data network, or some combination thereof. In various embodiments, network interface 910 may support communication via wired or wireless general data networks, such as any suitable type of Ethernet network, for example; via telecommunications/telephony networks such as analog voice networks or digital fiber communications networks; via storage area networks such as Fibre Channel SANs, or via any other suitable type of network and/or protocol.

Input/output devices 912 may, in some embodiments, include one or more display terminals, keyboards, keypads, touchpads, scanning devices, voice or optical recognition devices, or any other devices suitable for entering or accessing data by one or more computer systems 900. Multiple input/output devices 912 may be present in computer system 900 or may be distributed on various nodes of computer system 900. In some embodiments, similar input/output devices may be separate from computer system 900 and may interact with one or more nodes of computer system 900 through a wired or wireless connection, such as over network interface 910.

Those skilled in the art will appreciate that computer system 900 is merely illustrative and is not intended to limit the scope of embodiments. In particular, the computer system and devices may include any combination of hardware or software that can perform the indicated functions, including computers, network devices, Internet appliances, PDAs, wireless phones, pagers, etc. Computer system 900 may also be connected to other devices that are not illustrated, or instead may operate as a stand-alone system. In addition, the functionality provided by the illustrated components may in some embodiments be combined in fewer components or distributed in additional components. Similarly, in some embodiments, the functionality of some of the illustrated components may not be provided and/or other additional functionality may be available.

The various systems and methods as illustrated in the figures and described herein represent example embodiments of methods. The systems and methods may be implemented manually, in software, in hardware, or in a combination thereof. The order of any method may be changed, and various elements may be added, reordered, combined, omitted, modified, etc.

Although the embodiments above have been described in considerable detail, numerous variations and modifications may be made as would become apparent to those skilled in the art once the above disclosure is fully appreciated. It is intended that the following claims be interpreted to embrace all such modifications and changes and, accordingly.

What is claimed is:

1. A camera system, comprising:
    an optics assembly comprising one or more lenses;
    an image sensor;
    a plurality of position sensors including a first position sensor and a second position sensor configured to produce a first sensor signal and a second sensor signal based at least in part on a first magnetic field of a first magnet and a second magnetic field of a second magnet respectively, wherein the first and second position sensors are coupled in parallel in a first configuration or a second configuration to produce a combined sensor output, wherein in the first configuration, (a) the first magnet and the second magnet are arranged proximate the first position sensor and the second position sensor with opposite polarities and (b) the first position sensor and the second position sensor are coupled in parallel with reverse polarities, and wherein in the second configuration, (c) the first magnet and the second magnet are arranged proximate the first position sensor and the second position sensor with same polarities and (d) the first and second position sensor are coupled in parallel with same polarities; and
    a signal processing circuit configured to determine, based at least in part on the combined sensor output, position information for the at least one of the optics assembly or the image sensor.

2. The camera system of claim 1, wherein the first and second magnets are configured to be moveable with the at least one of the optics assembly or the image sensor.

3. The camera system of claim 1, wherein the first and second position sensors are configured to be moveable with the at least one of the optics assembly or the image sensor.

4. The camera system of claim 1, wherein the first and second position sensors include one or more of a Hall sensor, a tunneling magnetoresistance (TMR) sensor, a giant magnetoresistance (GMR) sensor, or an anisotropic magnetoresistance (AMR) sensor.

5. The camera system of claim 1, further comprising:
    an actuator configured to move the at least one of the optics assembly or the image sensor based at least in part on the determined position information from the signal processing circuit.

6. The camera system of claim 5, wherein the actuator includes a voice coil motor (VCM) actuator.

7. The camera system of claim 1, wherein the combined sensor output includes an average of the first and second sensor signals.

8. A device, comprising:
- a plurality of position sensors including a first position sensor and a second position sensor configured to produce a first sensor signal and a second sensor signal based at least in part on a first magnetic field of a first magnet and a second magnetic field of a second magnet respectively, wherein the first and second position sensors are coupled in parallel in a first configuration or a second configuration to produce a combined sensor output, wherein in the first configuration, (a) the first magnet and the second magnet are arranged proximate the first position sensor and the second position sensor with opposite polarities and (b) the first position sensor and the second position sensor are coupled in parallel with reverse polarities, and wherein in the second configuration, (c) the first magnet and the second magnet are arranged proximate the first position sensor and the second position sensor with same polarities and (d) the first and second position sensor are coupled in parallel with same polarities; and
- a signal processing circuit configured to determine, based at least in part on the combined sensor output, position information for at least one of an optics assembly or an image sensor.

9. The device of claim 8, wherein the first and second magnets are configured to be moveable with the at least one of the optics assembly or the image sensor.

10. The device of claim 8, wherein the first and second position sensors are configured to be moveable with the at least one of the optics assembly or the image sensor.

11. The device of claim 8, wherein the first and second position sensors include one or more of a Hall sensor, a tunneling magnetoresistance (TMR) sensor, a giant magnetoresistance (GMR) sensors, or an anisotropic magnetoresistance (AMR) sensor.

12. The device of claim 8, further comprising:
- an actuator configured to move the at least one of the optics assembly or the image sensor based at least in part on the determined position information from the signal processing circuit.

13. The device of claim 12, wherein the actuator includes a voice coil motor (VCM) actuator.

14. The device of claim 8, wherein the combined sensor output includes an average of the first and second sensor signals.

15. A method for position measurement of a camera system, comprising:
- providing a first sensor signal and a second sensor signal with a first position sensor and a second position sensor configured to measure respectively a first magnetic field of a first magnet and a second magnetic field of a second magnet;
- coupling the first and second position sensors in parallel in a first configuration or a second configuration to produce a combined sensor output, wherein in the first configuration, (a) the first magnet and the second magnet are arranged proximate the first position sensor and the second position sensor with opposite polarities and (b) the first position sensor and the second position sensor are coupled in parallel with reverse polarities, and wherein in the second configuration, (c) the first magnet and the second magnet are arranged proximate the first position sensor and the second position sensor with same polarities and (d) the first and second position sensor are coupled in parallel with same polarities; and
- determining position information for at least one of an optics assembly or an image sensor of the camera system based at least in part on the combined sensor output.

16. The method of claim 15, wherein the first and second magnets are configured to be moveable with the at least one of the optics assembly or the image sensor.

17. The method of claim 16, wherein in the first configuration, the first position sensor and the second position sensor generate a first output voltage and a second output voltage with opposite polarities, and wherein in the second configuration, the first position sensor and the second position sensor generate the first output voltage and the second output voltage with same polarities.

18. The method of claim 15, wherein the first and second position sensors are configured to be moveable with the at least one of the optics assembly or the image sensor.

19. The method of claim 15, wherein the first and second position sensors include one or more of a Hall sensor, a tunneling magnetoresistance (TMR) sensor, a giant magnetoresistance (GMR) sensor, or an anisotropic magnetoresistance (AMR) sensor.

20. The method of claim 15, further comprising:
- moving the at least one of the optics assembly or the image sensor with at least one actuator based at least in part on the determined position information from the signal processing circuit.

* * * * *